US011275133B2

(12) United States Patent
Loew et al.

(10) Patent No.: US 11,275,133 B2
(45) Date of Patent: Mar. 15, 2022

(54) ASYMMETRIC BIRDCAGE COIL

(71) Applicant: Children's Hospital Medical Center, Cincinnati, OH (US)

(72) Inventors: Wolfgang Manfred Loew, Cincinnati, OH (US); Charles Lucian Dumoulin, Cincinnati, OH (US)

(73) Assignee: Children's Hospital Medical Center, Cincinnati, OH (US)

( * ) Notice: Subject to any disclaimer, the term of this patent is extended or adjusted under 35 U.S.C. 154(b) by 0 days.

(21) Appl. No.: 17/222,811

(22) Filed: Apr. 5, 2021

(65) Prior Publication Data

US 2021/0223337 A1      Jul. 22, 2021

Related U.S. Application Data

(63) Continuation-in-part of application No. 17/137,922, filed on Dec. 30, 2020, which is a continuation of
(Continued)

(51) Int. Cl.
 *G01R 33/34*    (2006.01)
 *G01R 33/36*    (2006.01)

(52) U.S. Cl.
 CPC ... *G01R 33/34076* (2013.01); *G01R 33/3657* (2013.01)

(58) Field of Classification Search
 CPC .......... G01R 33/34076; G01R 33/3657; G01R 33/3415; G01R 33/34007
 See application file for complete search history.

(56) References Cited

U.S. PATENT DOCUMENTS 4,591,818 A    5/1986   Butson
6,591,128 B1*  7/2003   Wu ................... G01R 33/34084
                                                    324/318
(Continued)

FOREIGN PATENT DOCUMENTS

CN      106980097 A     7/2017
CN      206930769 A     1/2018

OTHER PUBLICATIONS

Rios et al., "Design and construction of an optimized transmit/receive hybrid birdcage resonator to improve full body images of medium-sized animals in 7T scanner", Feb. 1, 2018, PloS ONE:e0192035. (Year: 2018).*

(Continued)

*Primary Examiner* — Susan S Lee
(74) *Attorney, Agent, or Firm* — BakerHostetler

(57) ABSTRACT

A birdcage coil for a magnetic resonance imaging (MRI) system, the birdcage coil includes: a relatively planar birdcage coil section, including a pair of relatively planar ring portions and a plurality of conductive, elongated rungs extending between the pair of relatively planar ring portions; and a relatively domed birdcage coil section, including a pair of relatively domed ring portions and a plurality of conductive, elongated rungs extending between the pair of relatively domed ring portions. The relatively domed birdcage coil section is releasably coupled to the relatively planar birdcage coil section. In an embodiment, at least two sets of the relatively planar and domed birdcage coil sections are provided, where each of the at least two sets is configured to a different MRI application.

19 Claims, 14 Drawing Sheets

Related U.S. Application Data application No. 16/437,234, filed on Jun. 11, 2019, now Pat. No. 10,884,079.

(60) Provisional application No. 62/683,252, filed on Jun. 11, 2018.

(56) References Cited

U.S. PATENT DOCUMENTS

| | | | |
|---|---|---|---|
| 7,292,038 | B2 | 11/2007 | Doty |
| 7,345,481 | B2 | 3/2008 | Leussler |
| 8,013,609 | B2 | 9/2011 | Vartiovaara |
| 8,947,084 | B2 | 2/2015 | Habara et al. |
| 9,638,771 | B2 | 5/2017 | Soutome et al. |
| 10,816,621 | B2 | 10/2020 | Dumoulin et al. |
| 2004/0236209 | A1* | 11/2004 | Misic ............... A61B 5/055 600/423 |
| 2006/0238198 | A1 | 10/2006 | Nabetani |
| 2007/0096731 | A1* | 5/2007 | Peshkovsky ......... G01R 33/441 324/300 |
| 2009/0192382 | A1 | 7/2009 | Nistler et al. |
| 2012/0025833 | A1 | 2/2012 | Iwama et al. |
| 2014/0145722 | A1 | 5/2014 | Suzuki |
| 2014/0197832 | A1 | 7/2014 | Driesel et al. |
| 2015/0102813 | A1 | 4/2015 | Dumoulin et al. |
| 2015/0293188 | A1* | 10/2015 | Haider ............. G01R 33/34084 324/307 |
| 2016/0291100 | A1* | 10/2016 | Ha ................... G01R 33/3607 |
| 2019/0170837 | A1 | 6/2019 | Findeklee et al. |
| 2021/0223337 | A1 | 7/2021 | Loew et al. |

OTHER PUBLICATIONS

Zanche et al., "Asymmetric Quadrature Split Birdcage Coil for Hyperpolized 3He Lung MRI at 1.5T", Magnetic Resonance in Medicine 60:431-438. (Year: 2008).*

Walkup et al.; "Translational applications of hyperpolarized 3He and 129Xe"; NMR in Biomedicine; vol. 27, Dec. 2014; p. 1429-1438 (abstract only).

Stewart et al.; "Reproducibility of quantitative indices of lung function and microstructure from 129Xe chemical shift saturation recovery (CSSR) MR spectroscopy"; Magnetic Resonance in Medicine; vol. 77; Jun. 2017; p. 2107-2113.

Kaushik et al.; "Single-breath clinical imaging of hyperpolarized 129xe in the airspaces, barrier, and red blood cells using an interleaved 3D radial 1-point Dixon acquisition"; Magnetic Resonance in Medicine; vol. 75; Apr. 2016; p. 1434-1443.

Ruppert et al.; "Detecting pulmonary capillary blood pulsations using hyperpolarized xenon-129 chemical shift saturation recovery (CSSR) MR spectroscopy"; Magnetic Resonance in Medicine; vol. 75; Apr. 2016; p. 1771-1780.

Wetterling et al.; "Whole body sodium MRI at 3T using an asymmetric birdcage resonator and short echo time sequence: first images of a male volunteer"; Physics in Medicine & Biology; vol. 57; 2012; p. 4555-4567.

Zanche et al.; "Asymmetric quadrature split birdcage coil for hyperpolarized 3He lung MRI at 1,5T"; Magnetic Resonance in Medicine; vol. 60; Aug. 2008; p. 431-438.

Dregely et al.; "32-channel phased-array receive with asymmetric birdcage transmit coil for hyperpolarized xenon-129 lung imaging"; Magnetic Resonance in Medicine; vol. 70; Aug. 2013; p. 576-583.

International Patent Application No. PCT/US2019/036472; Int'l Search Report and the Written Opinion; dated Aug. 28, 2019; 20 pages.

European Patent Application No. 19819376.5; Extended Search Report; dated Feb. 8, 2022; 12 pages.

Watkins et al.; "High-pass bird-cage coil for nuclear-magnetic resonance"; Rev. Sci. Instruments; vol. 59 No. 6; Jun. 1988; p. 926-929.

"4408"; Proc. Int'l Soc. Mag. Reason. Medicine; No. 4408; Jun. 2018, 5 pages.

* cited by examiner

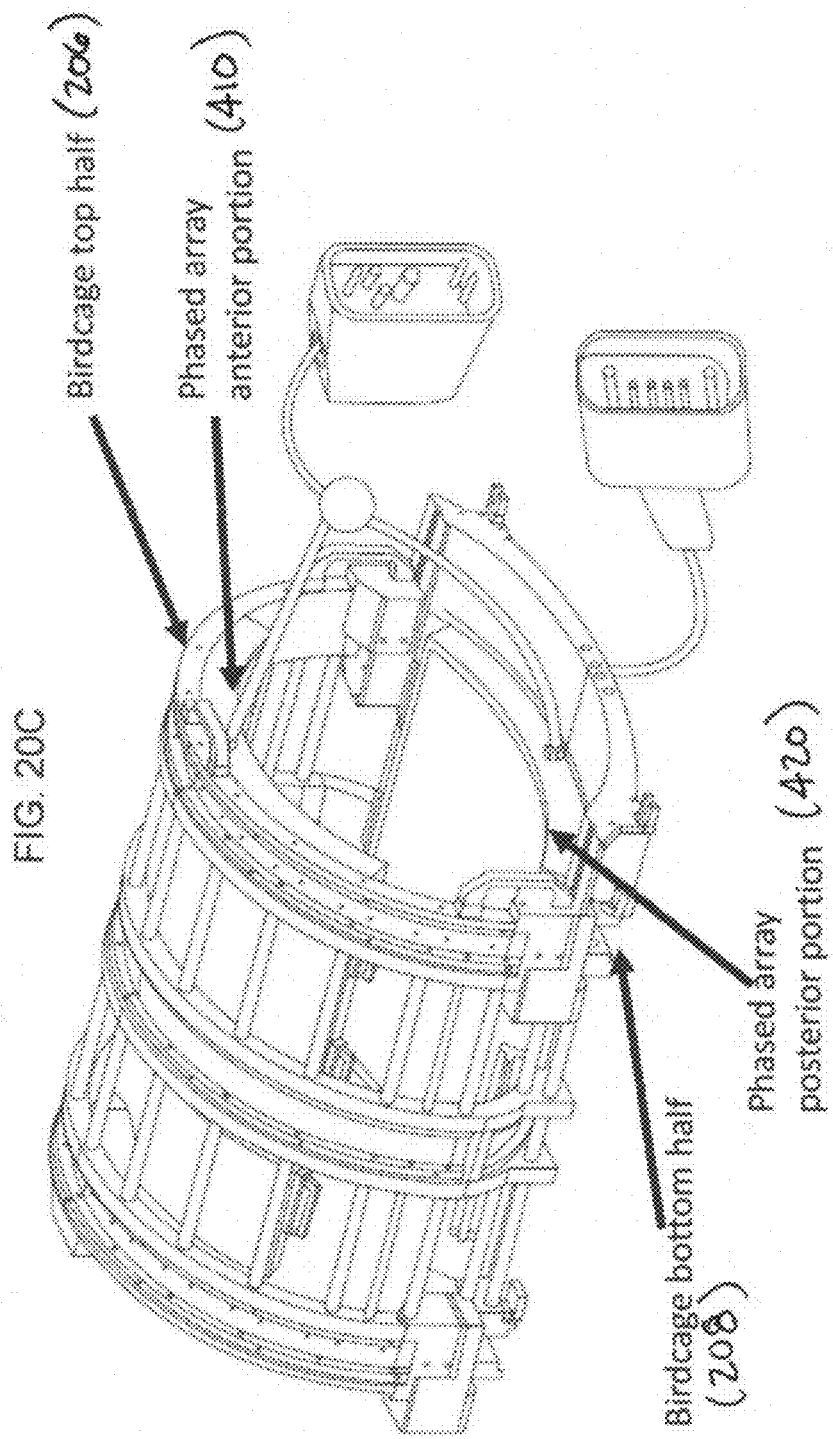

ASYMMETRIC BIRDCAGE COIL

CROSS REFERENCE TO RELATED APPLICATIONS

The current application is a continuation in part of U.S. patent application Ser. No. 17/137,922 filed Dec. 30, 2020, which is a continuation of U.S. patent application Ser. No. 16/437,234 filed Jun. 11, 2019 and issued as U.S. Pat. No. 10,884,079, and which claims priority to U.S. Provisional Application Ser. No. 62/683,252 filed Jun. 11, 2018, the entire disclosures of which are incorporated herein by reference.

BACKGROUND

Magnetic Resonance Imaging (MRI) employs a strong magnetic field, B0, that is used to polarize the spin magnetization in a patient's body. The spin magnetization that is most often used in MRI arises from the nuclei of hydrogen atoms within the body. Although the highest concentration of hydrogen atoms within the body is found in water molecules, other compounds found in the body (e.g. lipids, glucose, etc.) are present in sufficient concentration to provide a detectable MR spin magnetization. MRI can be performed on a number of nuclei such as hydrogen-1 (referred to as proton), helium-3, lithium-7, carbon-13, fluorine-19, oxygen-17, sodium-23, phosphorus-31 and xenon-129. In most MRI applications, hydrogen-1 can be preferred due to its high gyromagnetic ratio and abundance in most tissues in the body, which can translate into high signal-to-noise ratio ("SNR").

When spin ½ nuclei of a patient's body are introduced into the polarizing magnetic field, the spin magnetization of the nuclei align in one of two states: with the magnetic field, or against the magnetic field. These two states occupy slightly different energy levels in a quantum mechanical system. By convention, the lowest energy level is called the ground state. It should be noted that the population of nuclear spins in the ground state is slightly higher than that of the higher energy state, resulting in a net magnetization of the macroscopic group of nuclei.

The energy difference between the two energy levels is directly proportional to the strength of the polarizing magnetic field. Thus, as the strength of the magnetic field is increased, the energy difference between the two states increases. The energy differences associated with typical MRI systems correspond to electromagnetic waves in the radiofrequency range. The specific frequency associated with the difference is called the Larmor frequency (typically given in MHz). The constant of proportionality that defines the relationship between the polarizing field (typically given in Tesla) and the Larmor frequency is a natural constant called the gyromagnetic ratio. This constant is unique for each MR active element. For Magnetic Resonance Imaging systems used in medicine, polarizing magnetic field fields are typically between 0.5 and 3.0 Tesla. For hydrogen atoms, these polarizing magnetic field strengths result in Larmor frequencies between 21.3 and 127.8 MHz. For xenon-129, these polarizing magnetic field strengths result in Larmor frequencies between 5.89 and 35.33 MHz. For xenon-129 a dedicated transmit coil is required with 35.3 MHz resonance at 3 T.

If the nuclear spin system immersed in a polarizing magnetic field is subjected to a rotating magnetic field at the Larmor frequency, B1, the spin system will absorb energy and the distribution of nuclear spins in the two energy states will be disturbed. The duration of the rotating magnetic field used to change the distribution of nuclear spins in the two energy states is typically limited, and applied with a strength sufficient to nutate the net spin magnetization from the longitudinal axis (i.e. parallel with the applied polarizing magnetic field) to the transverse plane (i.e. perpendicular to the applied polarizing field). The term "RF pulse" is conventionally used to describe this process since nutation is accomplished with a rotating magnetic field in the radiofrequency range and having a finite duration.

With time, the energy will be emitted by the spin system in a fashion that can be detected with a sensitive pickup coil. The absorption and re-emission of an RF signal is key to the formation of an MR image. This phenomenon is typically called "resonance".

When an MR signal is created, the frequency of the signal is precisely proportional to the strength of the magnetic field experienced by the nuclear spins. If all of the spins in a patient's body are in an identical magnetic field, then all the spins will resonate with the same frequency. Even though signals come from many different portions of the body, the MR imaging system has no way to distinguish one signal from another.

In order to provide spatial encoding of the MR signals (and hence enable the formation of an image), it is useful to create a transient inhomogeneity in the magnetic field. In typical MRI imaging systems this is accomplished with magnetic field gradient coils. Gradient coils typically are designed to create a magnetic field whose strength varies in a linear fashion over a selected volume within the magnet. Gradient coil sets are typically constructed to permit gradient fields to be created in three orthogonal directions within the bore of the magnet. Typical gradient coils driven by typical gradient amplifiers can generate a magnetic field gradient of 20 mT/m in less than 1 ms, and maintain that gradient with high fidelity for an extended period limited only by the heat dissipation of the gradient coils and amplifier.

A typical imaging system creates an image by employing a sequence of RF and magnetic field gradient pulses to establish a detectable MR signal in a selected plane. This signal is then spatially encoded using magnetic field gradient pulses to impart phase and frequency shifts to the MR signal which reveal the location of the signal source within the bore of the magnet. By selecting pulse sequence repetition times (TR), echo times (TE) and other pulse sequence parameters, the operator can tune the pulse sequence to be sensitive to a variety of intrinsic MR parameters found in the tissue of the patient (e.g. longitudinal relaxation time, T1, Transverse relaxation time, T2, and the like). Many pulse sequences are known to those skilled in the state of the art. These pulse sequences can collect data in two or three dimensions. They can also collect data in Cartesian, radial or spiral frameworks.

Hyperpolarized $^{129}$Xe imaging is increasingly viewed as a viable tool for assessing lung structure and function in patients[1]. Additionally, HP $^{129}$Xe is moderately soluble in tissues and possesses a large (>200 ppm) in-vivo chemical shift range, making dissolved-phase $^{129}$Xe MR uniquely sensitive to regional gas-exchange dynamics[2-4]. Selective excitation of dissolved $^{129}$Xe requires that large flip angle and frequency selective RF pulses be applied homogeneously across the entire thorax to avoid unintentionally exciting the gas-phase $^{129}$Xe. In general, the flip angle of an RF pulse increases with the duration of the pulse. With $^{129}$Xe MRI, however, a pulse duration that is longer than the gas exchange time loses its selectivity. Thus, there is a need for high B1 fields during excitation of $^{129}$Xe in the dissolved state. Furthermore, $^{129}$Xe body coils that fail to provide sufficiently uniform B1 fields will provide a spatially dependent B1 field. Since the flip angle of the RF pulse is an important contributor to the quantitative measurements of gas exchange, a homogeneous $^{129}$Xe body coil is desired.

Body coils in the form of birdcage coils are traditionally constructed using a cylindrical birdcage design with equidistant rung-spacing centered in the magnet's RF shield. Due to the restricted space available for placing a $^{129}$Xe body coil in a general-purpose MRI system, asymmetrical $^{129}$Xe birdcage coils have been developed to fit within the magnet bore and yet account for the presence of the patient table. Such asymmetrical coils have a generally flat bottom for riding on top of the patient table[5-7], producing a generally domed shape in cross-section (generally flat bottom to account for patient table but a cylindrical side and top to match the curvature of the magnet bore). However, the B1 homogeneity of theses designs was evaluated with the coil unloaded and only within the central slice locations. Thus, it remains unclear if these designs are suitable for truly quantitative dissolved-phase $^{129}$Xe MRI. And there is thus a need to develop such asymmetrical birdcage coil designs for homogeneous volume excitation for $^{129}$Xe imaging (and nuclei).

Whole-body MRI systems typically employ a cylindrical body coil embedded in the bore of the magnet. This coil is tuned to a specific frequency that is dictated by the field strength of the system. Consequently, if the field is changed (e.g., the magnet is ramped to a lower field for any reason), the body coil will no longer be tuned and thus will not be functional. Thus, a new body coil tuned to the new resonance frequency is required. Due to an existing body coil being embedded in the walls of the magnet, replacing it is a long and expensive field-service operation.

SUMMARY

To develop a suitable large and homogeneous $^{129}$Xe 3 T birdcage coil, the volume excitation performance of multiple coil designs was analyzed with electromagnetic simulations. The influence of the shield size and position of the coils were analyzed in detail. Results of the analysis were used to confirm exemplary optimized designs for homogeneous volume excitation necessary for $^{129}$Xe imaging.

As a result of such analysis, a first aspect of the current disclosure is to provide a birdcage coil for a magnetic resonance imaging (MRI) system that includes: (a) a pair of conductive end rings, each having a generally domed shape in axial cross section; (b) a plurality of conductive, elongated rungs extending between the pair of conductive end rings in an axial direction; and (c) an LC delay circuit incorporated into the pair of rings and the plurality of elongated rungs, where the LC delay circuit includes a plurality of capacitive elements and a plurality of inductive elements; where circumferential spacing between adjacent elongated rungs is varied to improve homogeneity of the volume excitation.

In a detailed embodiment of this first aspect, the length of the elongated rungs is varied so that the area between adjacent elongated rungs is substantially the same. In a further detailed embodiment, one or both of the pair of end rings are non-planar to account for the varied lengths of the elongated rungs.

In another detailed embodiment of this first aspect, the capacitive elements in the LC delay circuit are varied. In a further detailed embodiment, the capacitive elements in the LC delay circuit are varied to maintain a steady speed of delay about a circumference of the birdcage coil.

In another detailed embodiment of this first aspect, the varied circumferential spacing between adjacent elongated rungs is symmetrical between the left side and right side of the birdcage coil (where the bottom is the generally flat portion). Alternatively, or in addition, the varied circumferential spacing is wider on a bottom half and closer on a top half.

In another detailed embodiment of this first aspect, the birdcage coil is a high-pass birdcage coil, or the birdcage coil is a low-pass birdcage coil, or the birdcage coil is a band-pass coil. Alternatively, or in addition, the birdcage coil includes sixteen of the conductive, elongated rungs extending between the pair of conductive end rings in an axial direction.

A second aspect of the current disclosure is to provide a birdcage coil for a magnetic resonance imaging (MRI) system that includes: (a) a pair of conductive end rings, each having a generally domed shape in axial cross section; (b) a plurality of conductive, elongated rungs extending between the pair of conductive end rings in an axial direction; and (c) an LC delay circuit incorporated into the pair of rings and the plurality of elongated rungs, where the LC delay circuit includes a plurality of capacitive elements and a plurality of inductive elements; where at the capacitive elements and/or inductive elements are varied to provide a uniform rotational velocity of the magnetic field about a circumference of the birdcage coil. In a more detailed embodiment, the generally domed shaped end rings have a generally flat bottom, a generally rounded top, a left side and a right side; and the varied capacitive elements and/or inductive elements are symmetrical between the left side and right side. Alternatively, or in addition, the varied capacitive/inductive elements involves varied inductive elements. In a more detailed embodiment, the varied inductive elements involves varied dimensions of the elongated rungs. In a more detailed embodiment, the varied dimensions of the elongated rungs involve varied lengths of the elongated rungs and/or varied diameters of the elongated rungs.

A third aspect of the current disclosure is to provide a birdcage coil for a magnetic resonance imaging (MRI) system that includes: a pair of conductive end rings, each having at least one asymmetric dimension in axial cross section; a plurality of conductive, elongated rungs extending between the pair of conductive end rings in an axial direction; and an LC delay circuit incorporated into the pair of rings and the plurality of elongated rungs, where the LC delay circuit includes a plurality of capacitive elements and a plurality of inductive elements; where circumferential spacing between adjacent elongated rungs is varied to improve homogeneity of the volume excitation.

In a detailed embodiment of the third aspect, the length of the elongated rungs is varied so that the area between adjacent elongated rungs is substantially the same. In a further detailed embodiment, the pair of end rings are non-planar to account for the varied lengths of the elongated rungs.

In another detailed embodiment of the third aspect, the capacitive elements in the LC delay circuit are varied. In a further detailed embodiment, the capacitive elements in the LC delay circuit are varied to maintain a steady speed of delay about a circumference of the birdcage coil. These and other aspects and objects of the current disclosure will be apparent from the following description, the appended claims and the attached drawings.

In another aspect, a birdcage coil for a magnetic resonance imaging (MRI) system is provided, where the birdcage coil includes: a relatively planar birdcage coil section, including a pair of relatively planar ring portions and a plurality of conductive, elongated rungs extending between the pair of relatively planar ring portions; and a relatively domed birdcage coil section, including a pair of relatively domed ring portions and a plurality of conductive, elongated rungs extending between the pair of relatively domed ring portions. The relatively domed birdcage coil section is releasably coupled to the relatively planar birdcage coil section. In an embodiment, the relatively domed birdcage coil section includes handles to facilitate manual removal and replacement of the relatively domed birdcage coil section on the relatively planar birdcage coil section. In another embodiment, the relatively planar birdcage coil section is adapted to be couple to or integrated into a patent table received into and out of an MRI bore.

In another detailed embodiment, the birdcage coil includes at least two sets of the relatively planar and domed birdcage coil sections, where of the at least two sets is configured to a different MRI application. In a more detailed embodiment, the different MRI applications include at least two different MRI field strengths. In a further detailed embodiment, the at least two different MRI field strengths include a first field strength below 1 Tesla and a second field strength above 1 Tesla. Alternatively, or in addition, the different MRI applications include at least two different resonant frequencies. Alternatively, or in addition, each the at least two sets include means for providing a uniform rotational velocity of a magnetic field about a circumference of the birdcage coil respectively when each the at least two of the relatively domed birdcage coil sections are connected to the relatively planar birdcage coil section.

In an embodiment, the relatively planar birdcage coil section includes a surface for a patient to lay upon.

In an embodiment the birdcage coil includes a phased array coil incorporated therein. In a more detailed embodiment, the phased array coil includes an anterior portion coupled to the relatively domed birdcage coil section and a posterior portion coupled to the relatively planar birdcage coil section. In a further detailed embodiment, the anterior portion of the phased array coil is coupled to an inner side of the relatively domed birdcage coil section and the posterior portion of the phased array coil is coupled to an inner side of the relatively planar birdcage coil section.

In an embodiment the birdcage coil is configured only for transmission. In another embodiment the birdcage coil is configured for both transmission and reception.

Another aspect of the current disclosure provides a birdcage coil for a magnetic resonance imaging (MRI) system, where the birdcage coil includes: a pair of conductive end rings, each having a generally domed shape in axial cross section; and a plurality of conductive, elongated rungs extending between the pair of conductive end rings in an axial direction; where the birdcage coil is designed to be selectively opened along its axis. In a further detailed embodiment, the birdcage coil includes: a relatively planar birdcage coil section, including a pair of relatively planar ring portions and a plurality of conductive, elongated rungs extending between the pair of relatively planar ring portions; and a relatively domed birdcage coil section, including a pair of relatively domed ring portions and a plurality of conductive, elongated rungs extending between the pair of relatively domed ring portions; where the relatively domed birdcage coil section is releasably coupled to the relatively planar birdcage coil section so that the birdcage coil can be opened along its axis. In a further detailed embodiment, the birdcage coil further includes a mechanical linkage between the relatively domed birdcage section and the relatively planar birdcage section facilitating opening and closing of the birdcage coil. In a further detailed embodiment, the mechanical linkage includes a pivot assembly coupled between the relatively domed birdcage section and an MRI magnet housing, where the pivot assembly is configured to pivot the relatively domed birdcage section between an open position and a closed position. Alternatively, or in addition, the birdcage coil further includes a computer control associated with the mechanical linkage facilitating automated opening and closing of the birdcage coil.

Another aspect of the current disclosure provides an MRI system that includes: a magnet housing including a cylindrical superconducting magnet encased therein and an axial bore extending therethrough; a patient support table coupled to the magnet housing for moving a patient into and out of the axial bore; and an asymmetrical birdcage coil coupled to a top surface of the patient support table, the asymmetrical birdcage coil including a planar portion coupled to the top surface of the patient support table and a domed portion positioned over the planar portion; where the magnet housing does not include a body coil. In an embodiment, the asymmetrical birdcage coil including means for providing a uniform rotational velocity of a magnetic field about a circumference of the birdcage coil.

BRIEF DESCRIPTION OF THE DRAWINGS

FIG. 20C shows a perspective view of an embodiment of the asymmetrical birdcage coil incorporating a phased array coil.

DETAILED DESCRIPTION

MR imaging of internal body tissues may be used for numerous medical procedures, including diagnosis and surgery. In general terms, MR imaging starts by placing a subject in a relatively uniform, static magnetic field. The static magnetic field causes MR-active nuclei spins to align and precess about the general direction of the magnetic field. Radio frequency (RF) magnetic field pulses are then superimposed on the static magnetic field to cause some of the aligned spins to alternate between a temporary high-energy nonaligned state and the aligned state, thereby inducing an RF response signal, called the MR echo or MR response signal. It is known that different tissues in the subject produce different MR response signals, and this property can be used to create contrast in an MR image. An RF receiver detects the duration, strength, and source location of the MR response signals, and such data are then processed to generate tomographic or three-dimensional images.

Figure 1:
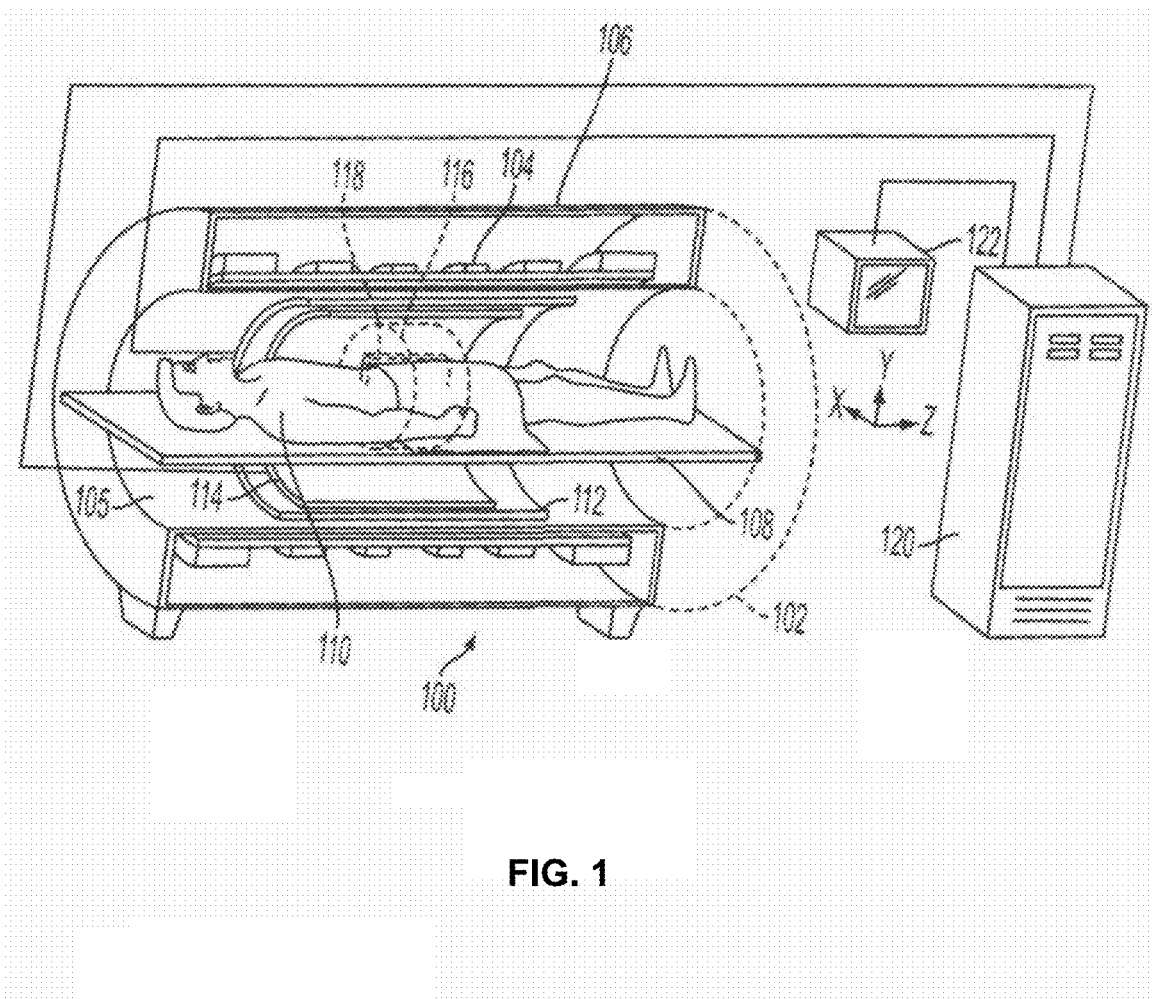
FIG. 1 is a block diagram representation of an MRI system environment for use with embodiments of the current disclosure.
Figure 2:
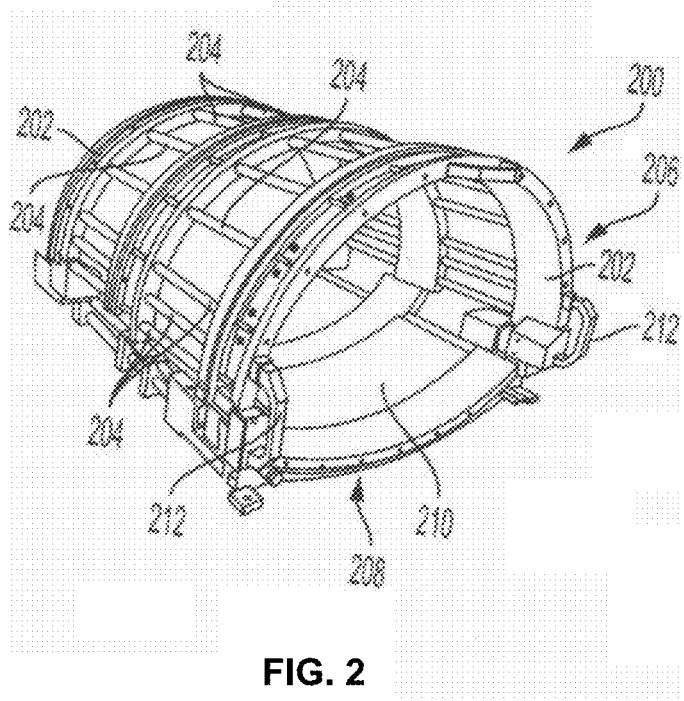
FIG. 2 is a perspective view of an exemplary birdcage coil according to an embodiment of the current disclosure.

FIG. 1 shows an exemplary MRI system 100 in or for which MR imaging in accordance with the present disclosure may be implemented. The illustrated MRI system 100 comprises an MRI magnet assembly 102. Since the components and operation of the MRI scanner are well-known in the art, only some basic components helpful in the understanding of the system 100 and its operation will be described herein.

The MRI magnet assembly 102 typically comprises a cylindrical superconducting magnet 104, which generates a static magnetic field within a bore 105 of the superconducting magnet 104. The superconducting magnet 104 generates a substantially homogeneous magnetic field within an imaging region 116 inside the magnet bore 105. The superconducting magnet 104 may be enclosed in a magnet housing 106. A support table 108, upon which a patient 110 lies, is disposed within the magnet bore 105. A region of interest 118 within the patient 110 may be identified and positioned within the imaging region 116 of the MRI magnet assembly 102.

A set of cylindrical magnetic field gradient coils 112 may also be provided within the magnet bore 105. The gradient coils 112 also surround the patient 110. The gradient coils 112 can generate magnetic field gradients of predetermined magnitudes, at predetermined times, and in three mutually orthogonal directions within the magnet bore 105. With the field gradients, different spatial locations can be associated with different precession frequencies, thereby giving an MR image its spatial resolution. An RF transmitter coil 114 surrounds the imaging region 116 and the region of interest 118. The RF transmitter coil 114 emits RF energy in the form of a rotating magnetic field into the imaging region 116, including into the region of interest 118.

The RF transmitter coil 114 can also receive MR response signals emitted from the region of interest 118. The MR response signals are amplified, conditioned and digitized into raw data using an image processing system 120, as is known by those of ordinary skill in the art. The image processing system 120 further processes the raw data using known computational methods, including fast Fourier transform (FFT), into an array of image data. The image data may then be displayed on a monitor 122, such as a computer CRT, LCD display or other suitable display.

Due to the size required for a $^{129}$Xe MRI body coil, asymmetrical birdcage coils have been developed that allow the $^{129}$Xe coil to fit within the bore and yet account for the presence of the patient table. Such asymmetrical coils have a generally flat bottom for riding on top of the patient table[7], producing a generally domed shape in cross-section (generally flat bottom to account for patient table but a cylindrical side and top to match the curvature of the magnet bore). The asymmetrical domed shape in cross-section allows the birdcage coils to fit snugly within the bore 105 opening over the support table 108.

Figure 3:
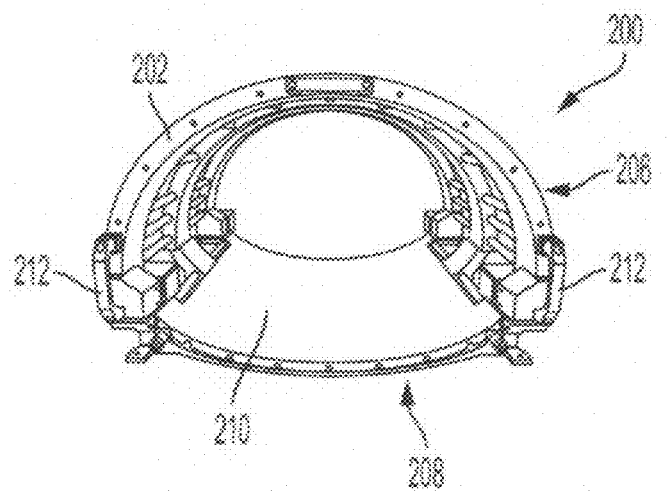
FIG. 3 is an end view of the exemplary birdcage coil of FIG. 2.
Figure 4:
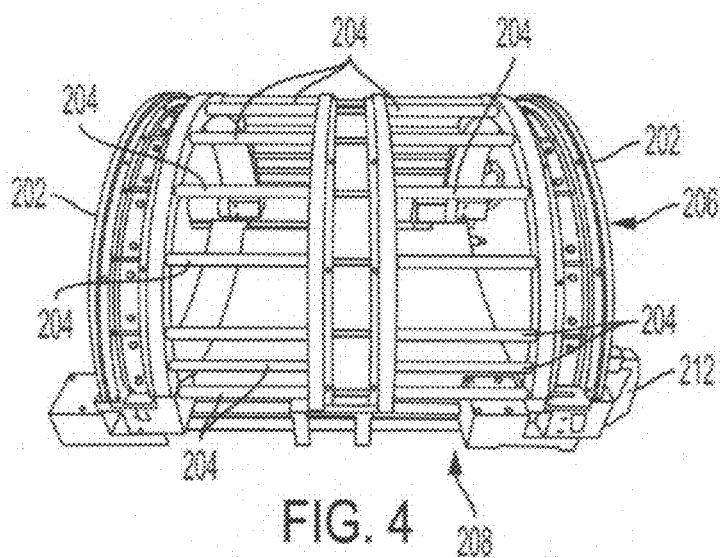
FIG. 4 is a side view of the exemplary birdcage coil of FIG. 2.
Figure 5:
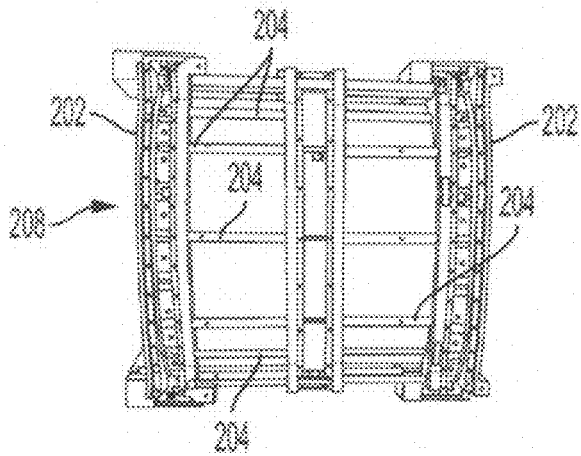
FIG. 5 is a bottom view of the exemplary birdcage coil of FIG. 2.

FIGS. 2-5 provide various views of an example asymmetrical birdcage coil 200 according the current disclosure. The asymmetrical birdcage coil 200 has a pair of conductive end rings 202, each having a generally domed shape in axial cross section (as best seen in FIG. 3), and a plurality of conductive, elongated rungs 204, extending between the conductive end rings 202. While the coil 200 in FIGS. 2-5 is a high-pass birdcage, it is within the scope of the current disclosure that the coil may be in the form of a low-pass birdcage or a band-pass birdcage.

The example birdcage coil 200 of FIGS. 2-5 has a top portion 206 and a bottom portion 208 that are coupled together to form the enclosing coil structure. A surface 210 is provided on the interior portion of the bottom portion 208 for the patient to lie upon. Handles 212 are provided to allow ease in separating, handling and coupling together the top and bottom portions 206, 208.

The birdcage coil 200 also includes an LC delay circuit incorporated into the coil as is well known to those of ordinary skill. The LC delay circuit will include a plurality of capacitive components and a plurality of inductive elements. In the embodiment shown in FIG. 2-5 circumferential spacing between adjacent elongated rungs 204 is varied to improve homogeneity of the volume excitation.

The specific measured circumferential spacing between elongated rungs 204 of the embodiment shown in FIGS. 2-5 (and the associated inductance as a result of such spacing) is provided in the following Table 1 and 2:

TABLE 1

Top-Portion Birdcage End-ring Lengths

| | Length | | Inductance | |
|---|---|---|---|---|
| | Front | Back | Front | Back |
| 1: | 54 mm | 54 mm | 21 nH | 21 nH |
| 2: | 78 mm | 78 mm | 36 nH | 36 nH |
| 3: | 81 mm | 81 mm | 38 nH | 38 nH |
| 4: | 85 mm | 85 mm | 41 nH | 41 nH |
| 5: | 88 mm | 88 mm | 43 nH | 43 nH |
| 6: | 89 mm | 89 mm | 44 nH | 44 nH |
| 7: | 89 mm | 89 mm | 44 nH | 44 nH |
| 8: | 85 mm | 85 mm | 41 nH | 41 nH |
| 9: | 81 mm | 81 mm | 38 nH | 38 nH |
| 10: | 78 mm | 78 mm | 36 nH | 36 nH |
| 11: | 55 mm | 55 mm | 22 nH | 22 nH |

TABLE 2

Bottom Portion Birdcage End-ring Lengths

| | Length | | Inductance | |
|---|---|---|---|---|
| | Front | Back | Front | Back |
| 1: | 73 mm | 73 mm | 33 nH | 33 nH |
| 2: | 136 mm | 136 mm | 77 nH | 76 nH |
| 3: | 149 mm | 149 mm | 87 nH | 87 nH |
| 4: | 135 mm | 135 mm | 77 nH | 77 nH |
| 5: | 71 mm | 71 mm | 32 nH | 32 nH |

Each of the rungs 204 in the embodiment shown in FIGS. 2-5 is approximately 547 mm long and 6.36 mm in diameter.

As can be seen in Tables 1 and 2, the dimensions between the front and back segments for this embodiments are intended to be identical. However, actual measurements may produce manufacturing or assembly variation differences of two or three millimeters. Referring to FIG. 3, the end ring segments listed in Tables 1 and 2 run in a clockwise direction, with the first segment of the upper portion located behind the left handle 212 and the last segment behind the right handle. For the bottom portion, the first segment is below the right handle 212 and the last segment is below the left handle.

Figure 6:
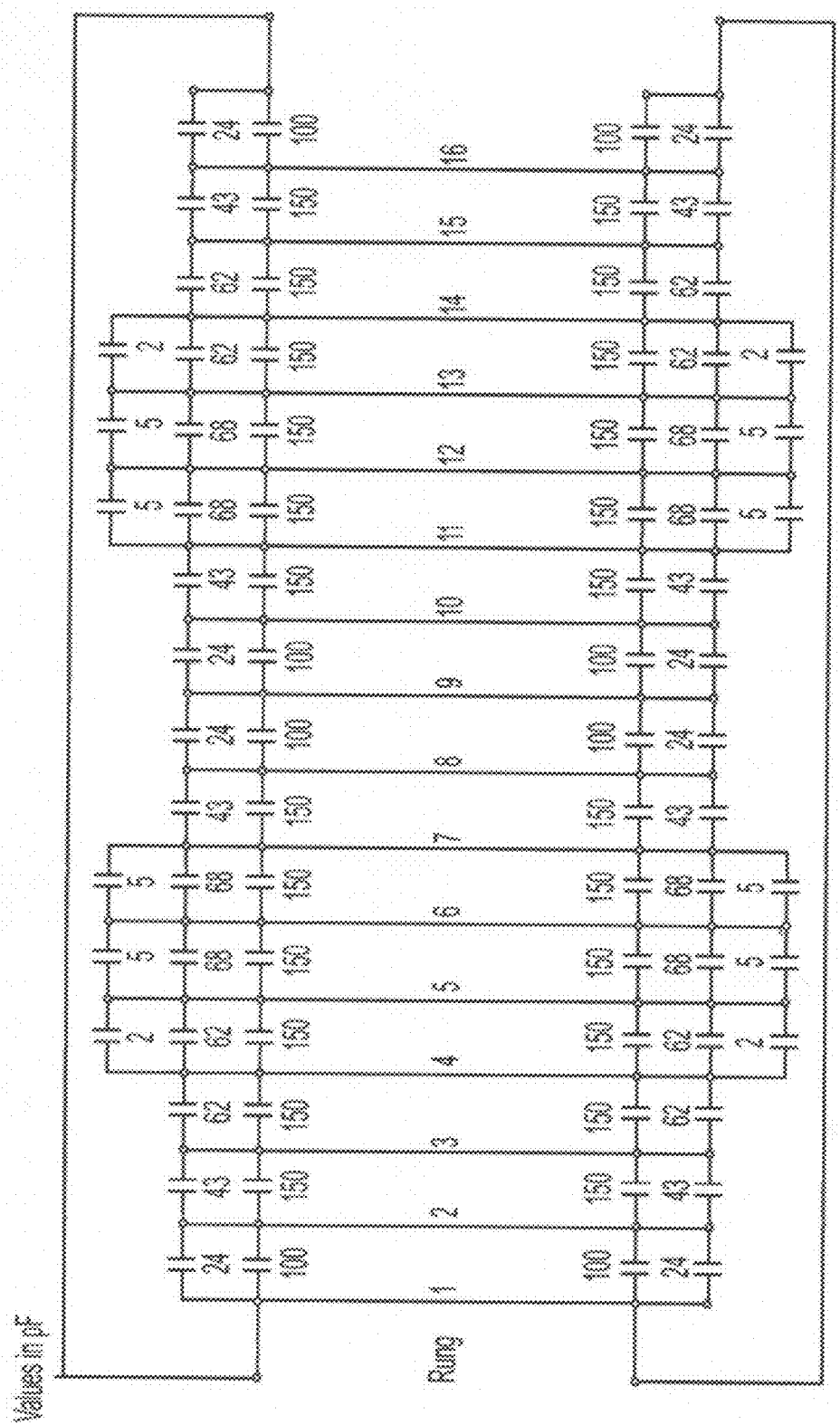
FIG. 6 is a circuit capacitance diagram representation of the birdcage coil of FIG. 2.

FIG. 6 provides the specific varying capacitance values for the LC circuit of the embodiment of FIGS. 2-5. These capacitance values were determined empirically on the bench to tune the coil to the $^{129}$Xe Larmor frequency at 3 Tesla. Note that FIG. 6 illustrates how a birdcage coil can be modeled as a delay line in which the inductances (rungs 1 through 16) and capacitances are selected to provide one full wavelength along the circumference of the coil. In the present embodiment of the invention, the capacitance values and spacing of the rungs is varied using electromagnetic simulations to optimize B1 homogeneity. In alternate embodiments the length of the inductive rungs is also varied.

With this embodiment, the varied circumferential spacing between the rungs 204 is generally symmetrical (as discussed above, with the exemplary embodiment there can be 2-3 mm variance) between the left and right sides (looking end-on as shown in FIG. 3). The varied spacing between the rungs 204 is wider in the bottom portion as compared to the top portion. The capacitances shown in FIG. 6 are chosen based upon an algorithm designed to maintain the steady speed delay about a circumference of the birdcage coil 200 based upon the inductance values measured in Tables 1 & 2.

In an embodiment, the rung spacing is a function of: the location of the birdcage inside the RF shield, the distance of each rung to the RF shield, and the shape of the ellipse that the rung location follows. For example, in the section of the birdcage coil where the shape follows an ellipse that is close to a cylindrical shape and the proximity of the rungs is close to the RF shield, the spacing/distance between the rungs is smaller—the rung density is larger. And in the section of the birdcage coil where the shape follows an ellipse that is stretched (more flat) and rungs are farther away from the RF shield, the spacing/distance between the rungs is larger—the rung density is smaller.

An important aspect of certain embodiments is that dynamic detuning of the birdcage coil is possible using approaches well known to those skilled in the state of the art. Dynamic detuning is useful for preventing inductive coupling of the birdcage coil with receive coils placed inside the birdcage coil. The use of receive coils that are smaller than the body coil permits greater sensitivity to the MR signal and offers higher Signal to Noise Ratios. The use of receive coil arrays offers the additional advantage of enabling image acquisition acceleration. Dynamic detuning is typically performed using resonant traps placed at various locations in the body coil. These traps are typically activated with bias currents that turn on diodes placed in the trap circuitry. In one embodiment, one trap is placed in the center of each rung of the body coil.

Development of the asymmetrical birdcage design according to the current embodiment is now described.

Figure 8:
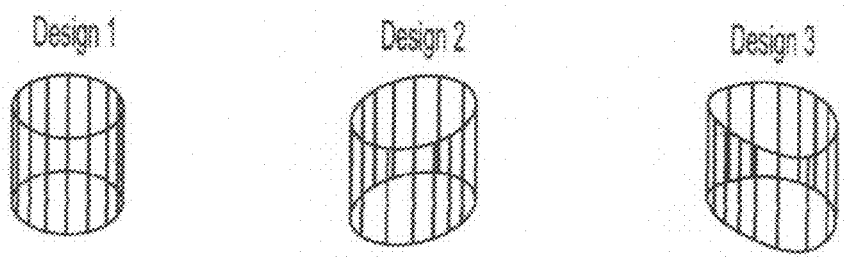
FIG. 8 is a representation of three initial analyzed coil designs in the analysis.
Figure 9:
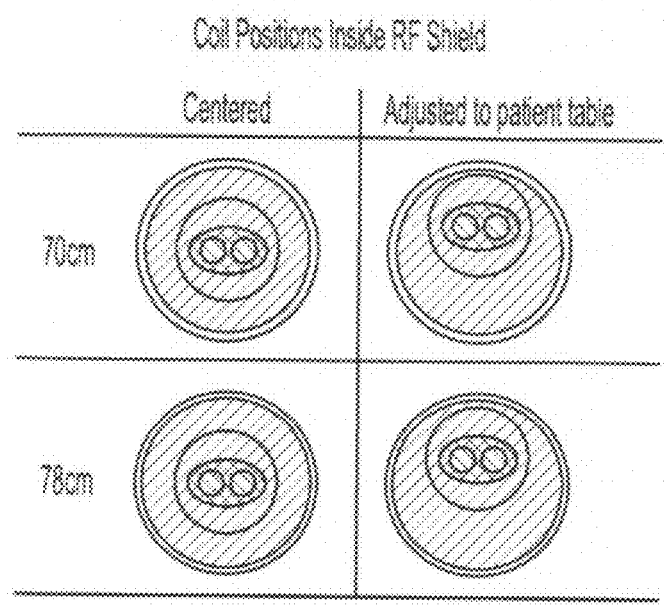
FIG. 9 is a representation of the coil positions inside the RF shield for the analyzed coil designs of FIG. 8.

Methods:

Electromagnetic field simulations were performed for three different 16-rung birdcage coil designs in electromagnetic simulation, as shown in FIG. 8: Design 1—cylindrical birdcage; Design 2—symmetrical elliptical birdcage; and Design 3—elliptical birdcage combined with two ellipse-halves with different short axes with rungs spaced equidistant. As shown in FIG. 9, each coil design was simulated with two RF shield diameters, 70 cm and 78 cm, at two locations, centered and adjusted to the patient table inside the RF shield.

Figure 7:
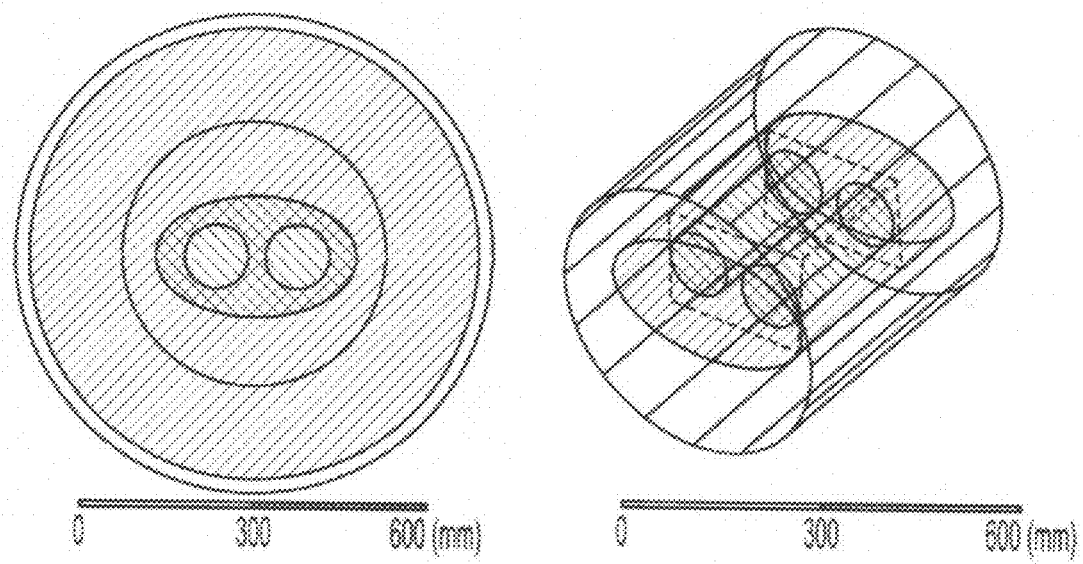
FIG. 7 is a representation of the simulation set-up using an elliptical phantom for developing birdcage coil designs disclosed herein.

As shown in FIG. 7, coils were loaded with a centered torso-shaped elliptical phantom 300 ($\varepsilon_r$=77.53 conductivity 0.4 S/m) with two cylinders 302 ($\varepsilon_r$=1) inside the phantom representing adult-sized xenon-air filled lungs.

Figure 10:
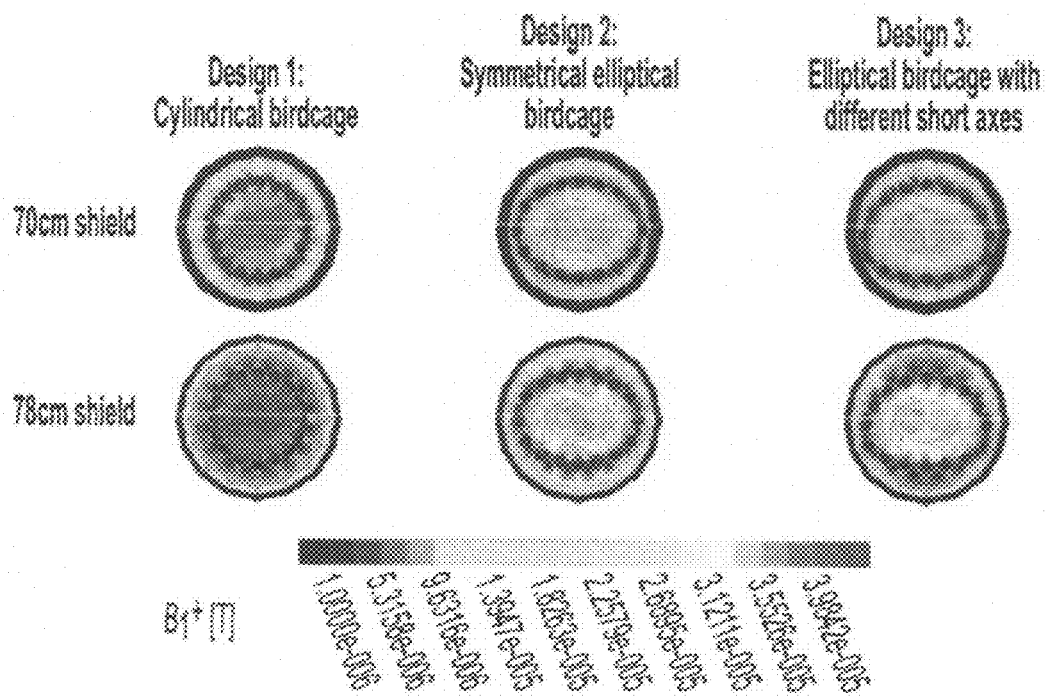
FIG. 10 shows the $B_1^+$ field distribution for the central axial slice with the coils of FIG. 8 centered inside the RF shield.
Figure 11:
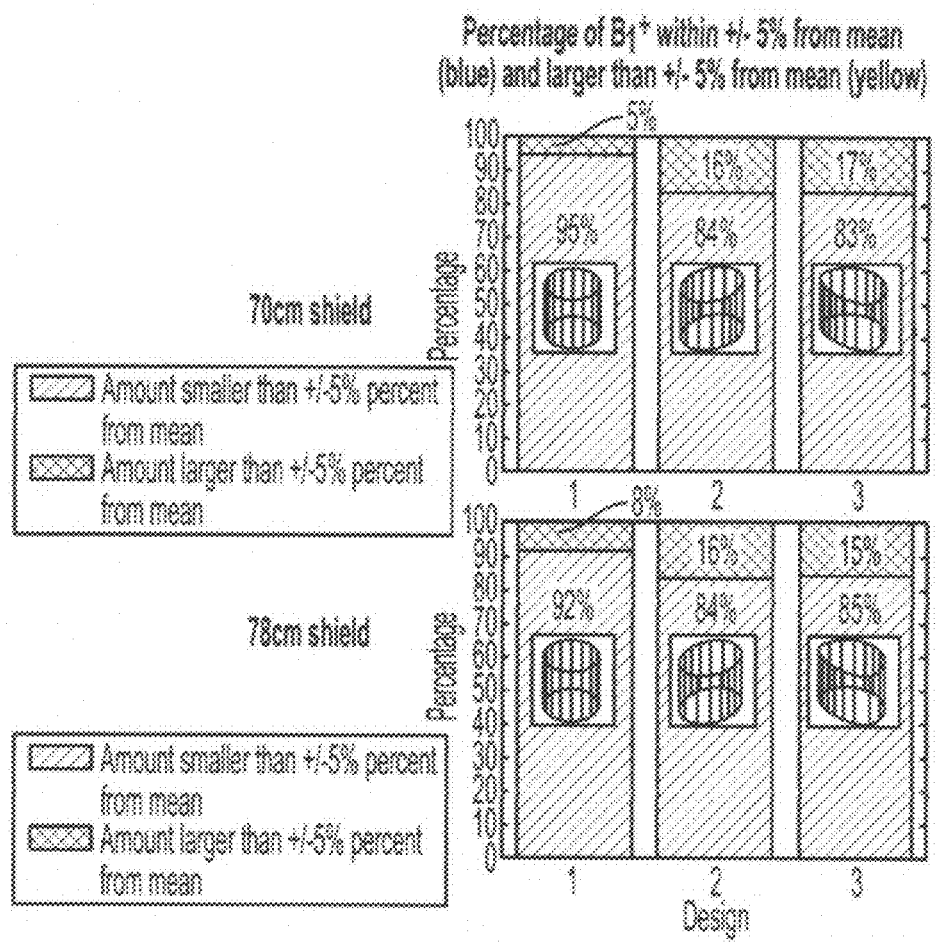
FIG. 11 shows the percentage of $B_1^+$ within +/−5% from mean and larger than +/−5% from mean for the coils of FIG. 8 centered inside the RF shield.
Figure 12:
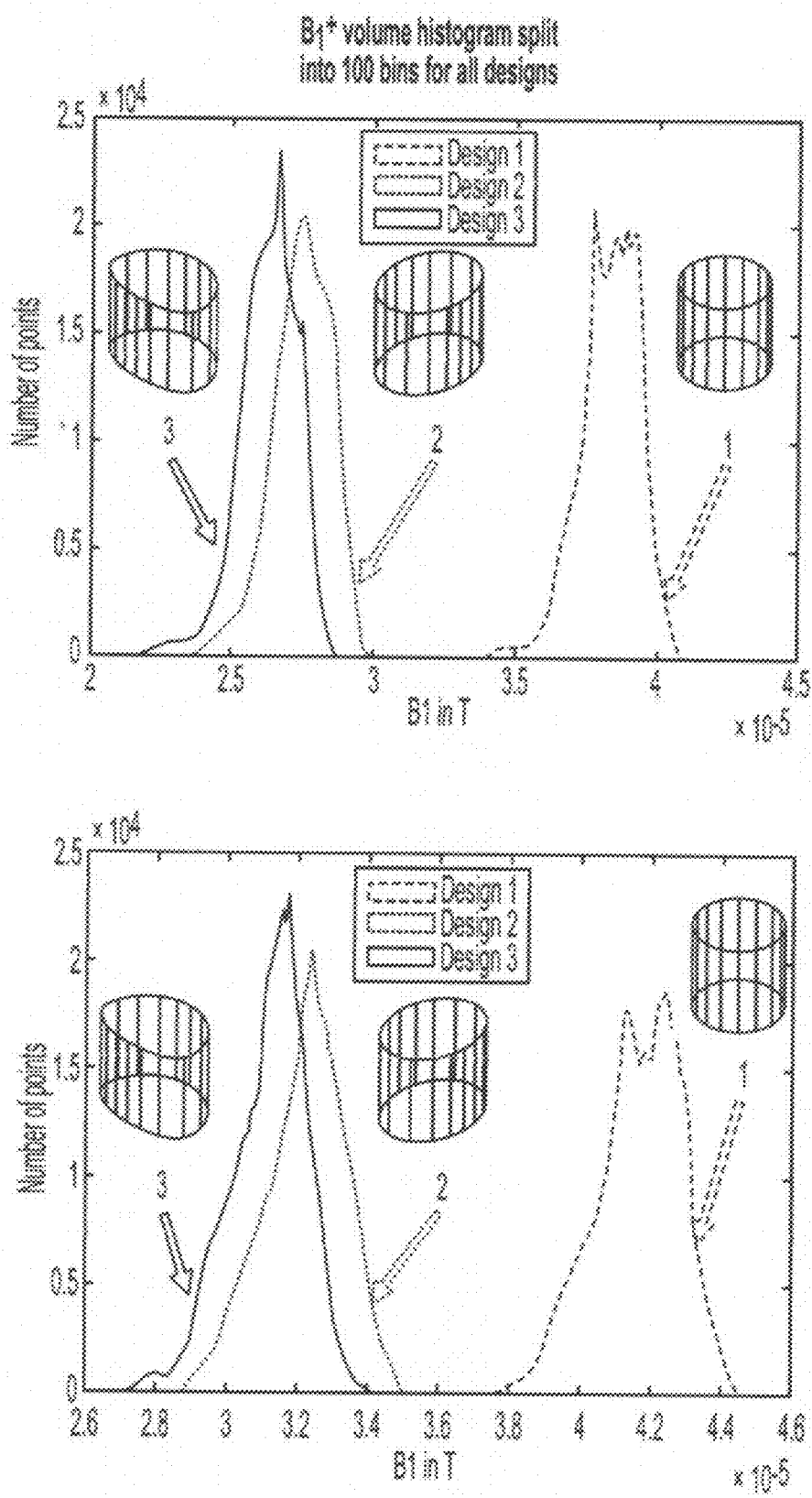
FIG. 12 shows the $B_1^+$ volume histogram split into 100 bins for the coils of FIG. 8 centered inside the RF shield.

The birdcages of FIG. 8 were excited with 35.3 MHz, 6A current sources placed at the center of each rung with phase shift increments of 22.5°. Field maps of the center axial slice and $B_1^+$ histograms for a 17 cm×25 cm×25 cm VOI centered inside the phantom were used for analytical comparison. A preferred deviation range inside the VOI of +/−5% from the mean $B_1^+$ was chosen as the target margin for comparison. FIG. 10 shows the $B_1^+$ field deviation for the central axial slice with the coils of FIG. 8 centered inside the RF shield. All of the three birdcage designs centered have a homogeneous $B_1^+$ axial slice profile. FIGS. 11 and 12 show the $B_1^+$ volume deviation with coils centered inside the RF shield. Again, all three of the birdcage designs of FIG. 8 have a homogeneous $B_1^+$ volume distribution when centered within the RF shield, where the cylindrical birdcage (Design 1) is the most efficient.

All birdcage designs for the centered shield case show a homogeneity >83% for the target margin of +/−5% from the mean $B_1^+$ inside the VOI. Design 1 has the highest homogeneous profile at 95%, in addition to being the most efficient of the designs. The larger shield diameter improved VOI homogeneity for design 3. Coil mean $B_1^+$ efficiency improved by 3.3 µT for design 1, 4.8 µT for design 2, and 4.9 µT for design 3.

Figure 13:
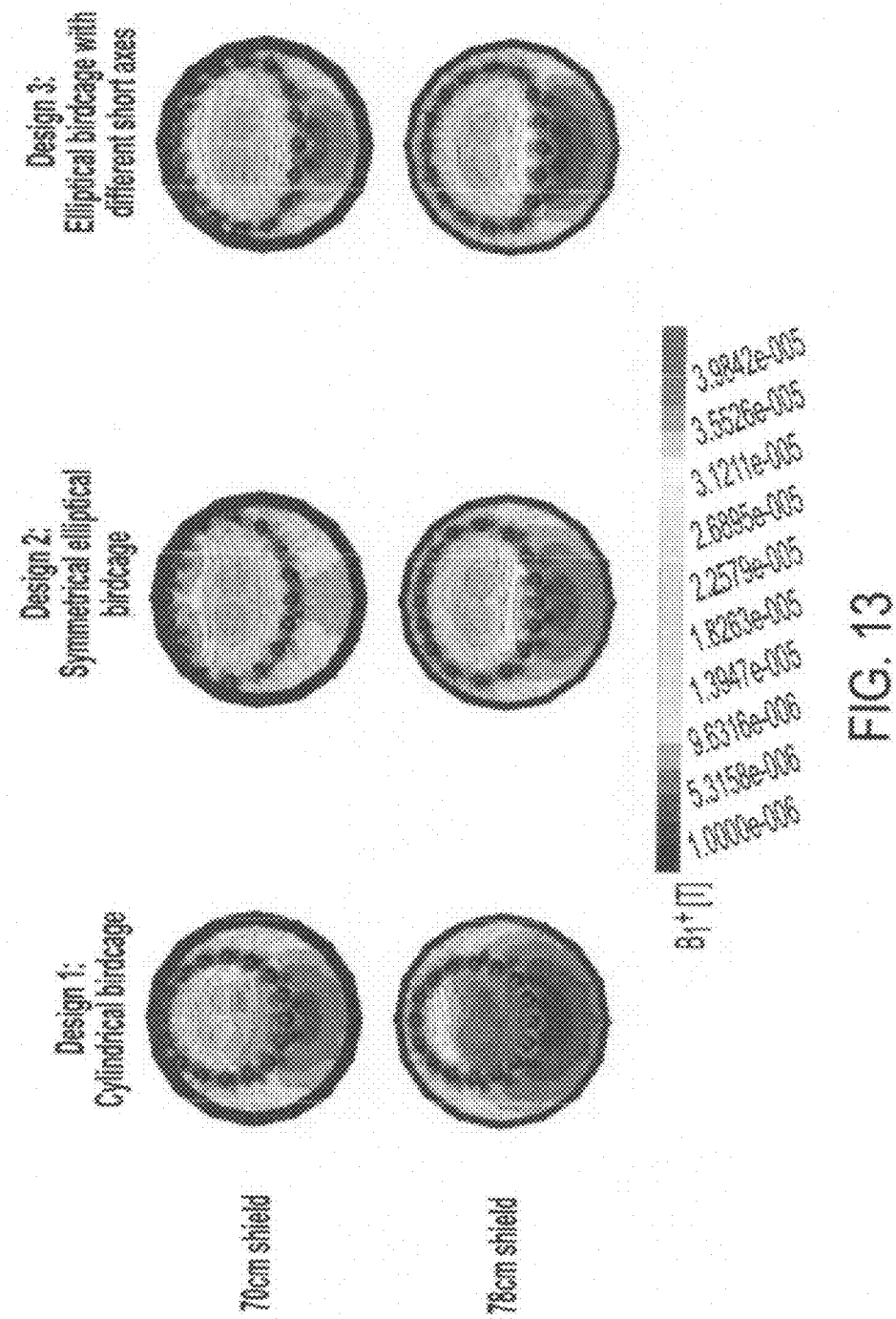
FIG. 13 shows the $B_1^+$ field distribution for the central axial slice with the coils of FIG. 8 adjusted to the patient table.
Figure 14:
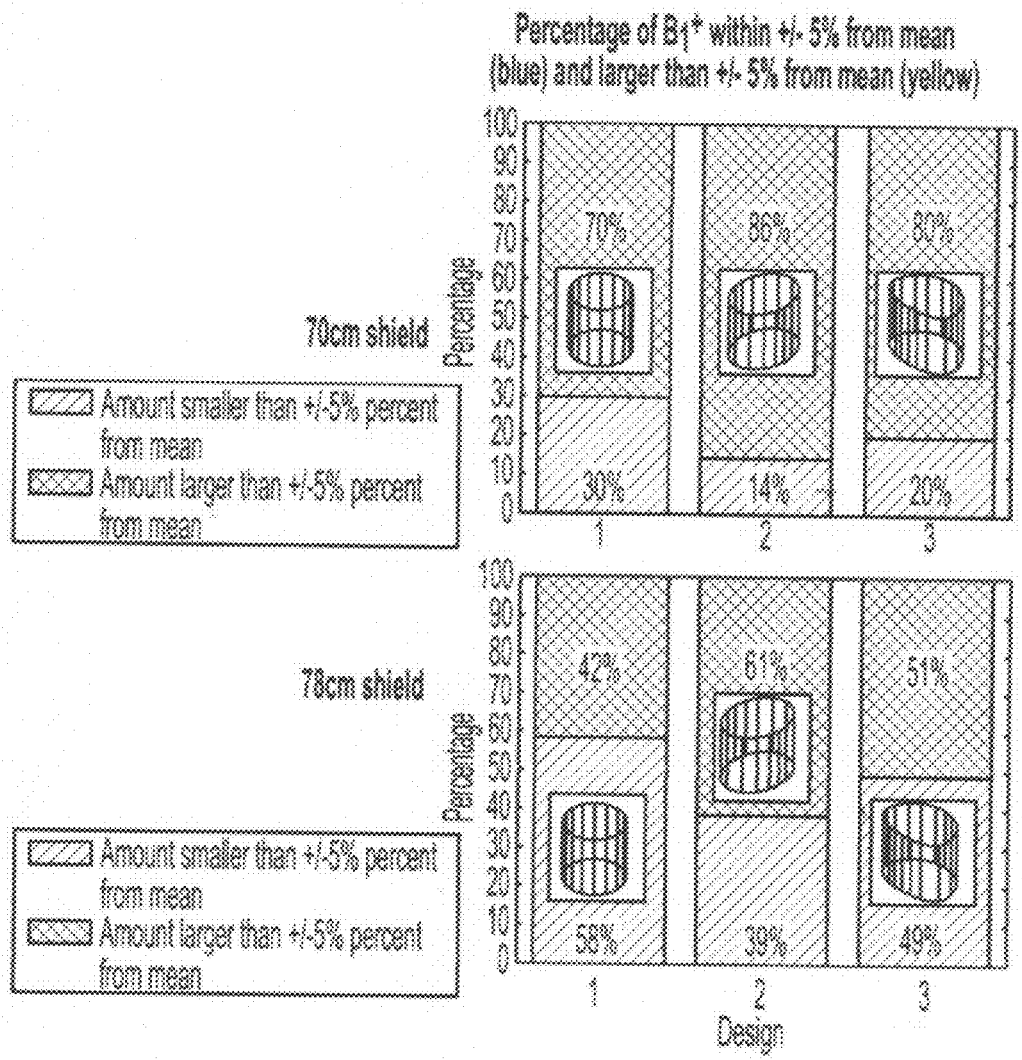
FIG. 14 shows the percentage of $B_1^+$ within +/−5% from mean and larger than +/−5% from mean for the coils of FIG. 8 adjusted for the patient table.
Figure 15:
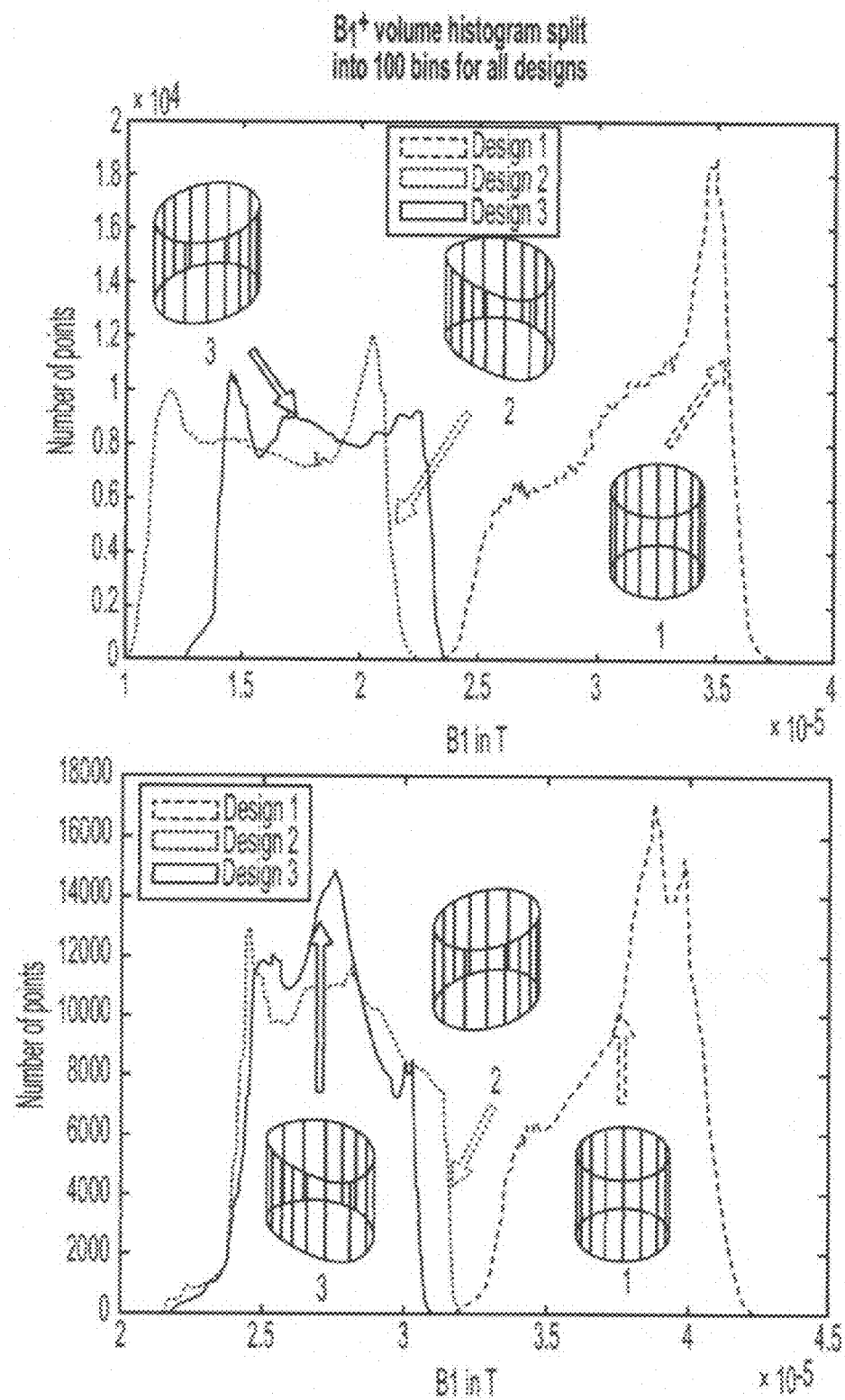
FIG. 15 shows the $B_1^+$ volume histogram split into 100 bins for the coils of FIG. 8 adjusted for the patient table.

But results changed when the birdcage designs of FIG. 8 were moved up in the RF shield to adjust to the patient table. FIG. 13 shows the field distribution for the central axial slice with the coils adjusted to the patient table. All three of the birdcage designs adjusted to the patient table have an inhomogeneous $B_1^+$ axial slice profile. FIGS. 14 and 15 show the $B_1^+$ volume deviation with the coils of FIG. 8 adjusted to the patient table. All three birdcage designs of FIG. 8 adjusted to the patient table have an inhomogeneous $B_1^+$ volume distribution, where the cylindrical (Design 1) is the most efficient.

Designs adjusted to the table position, however, showed highly inhomogeneous excitation profiles. In the patient table configuration, design 1 retained the highest homogeneous $B_1^+$ profile with 30% inside the margin for the 70 cm shield.

Figure 16:
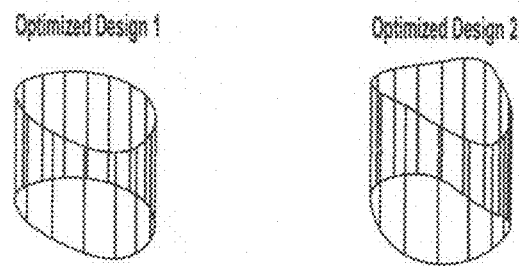
FIG. 16 is a representation of two exemplary improved (i.e., "optimized") coil designs according to the current disclosure.
Figure 17:
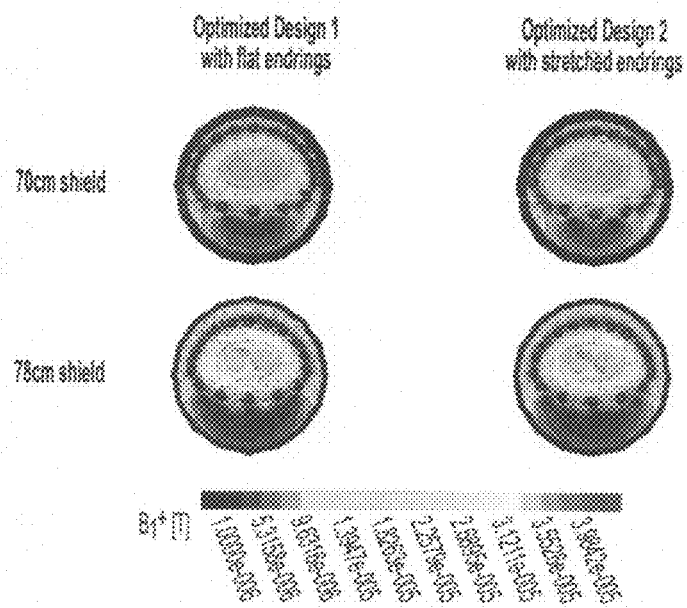
FIG. 17 shows the $B_1^+$ field distribution for the central axial slice with the exemplary coils of FIG. 16 adjusted to the patient table.

To improve $B_1^+$ homogeneity inside the VOI two optimized designs, shown in FIG. 16, were analyzed using a model that adjusted the coil to the patient table for both RF shield diameters. Optimized Design 1 is an elliptical birdcage with two ellipse-halves with different short axes with rungs spaced wider on the bottom half and closer on the top half. Optimized Design 2 is a stretched end-ring birdcage (non-planar end ring to account for varying length rungs) combined with two ellipse-halves with different short axes with rungs spaced wider on the bottom half and closer on the top half.

Figure 18:
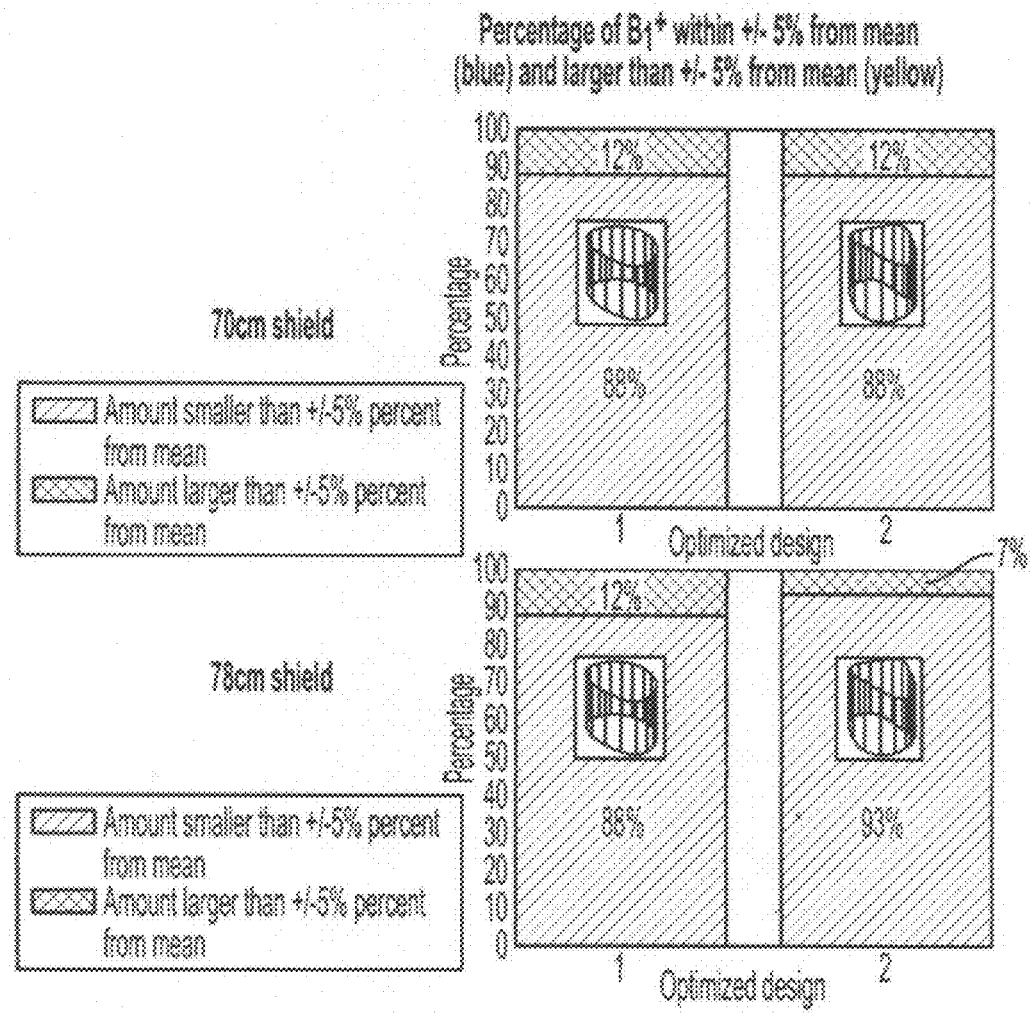
FIG. 18 shows the percentage of $B_1^+$ within +/−5% from mean and larger than +/−5% from mean for the exemplary coils of FIG. 16 adjusted for the patient table.
Figure 19:
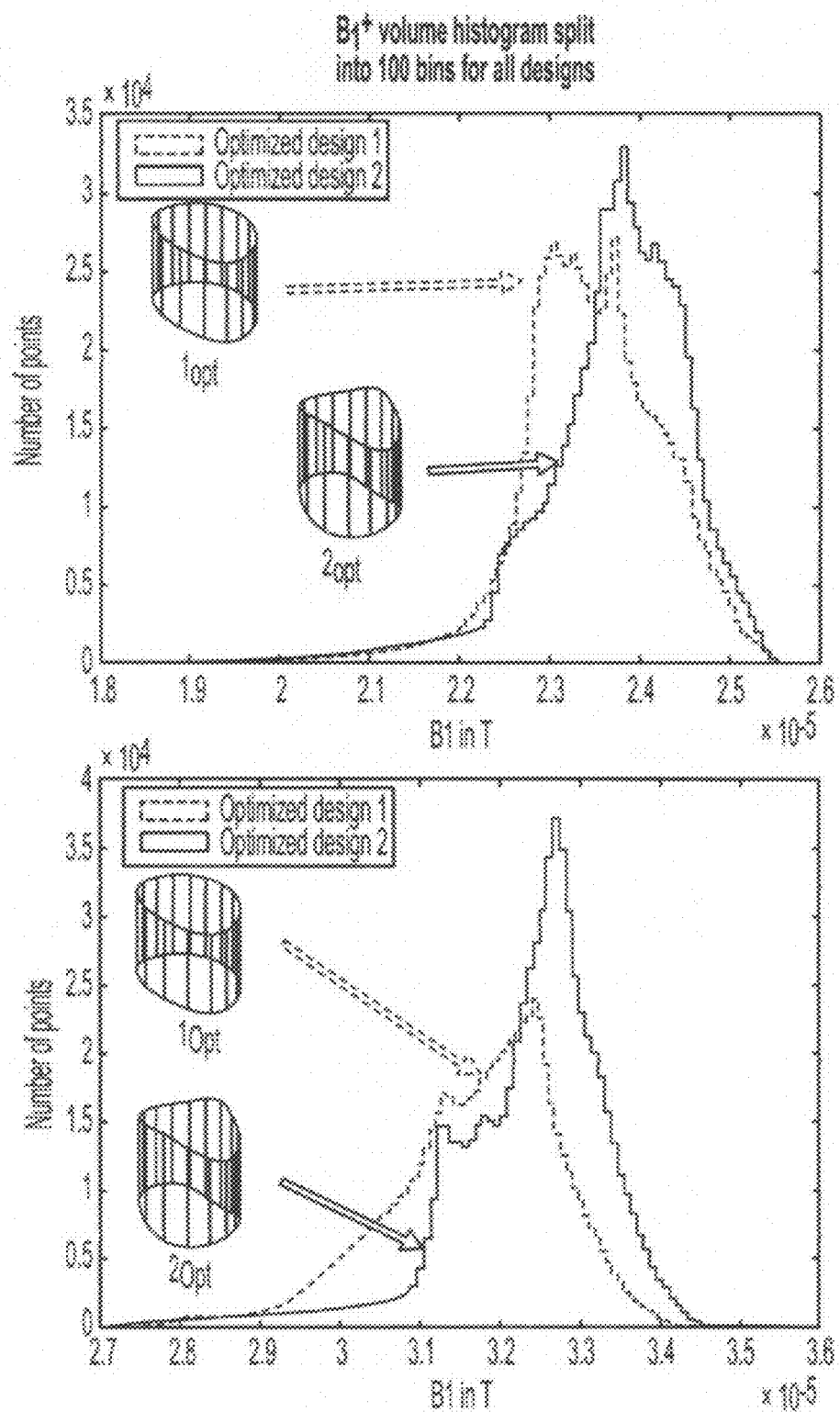
FIG. 19 shows the $B_1^+$ volume histogram split into 100 bins for the exemplary coils of FIG. 16 adjusted for the patient table.

FIG. 16 shows the field distribution for the central axial slice with the optimized design coils of FIG. 15 adjusted to the patient table. Both of the optimized birdcage designs of FIG. 16 adjusted to the patient table have a homogeneous $B_1^+$ axial slice profile. FIGS. 18 and 19 show the $B_1^+$ volume deviation with the coils of FIG. 16 adjusted to the patient table. Both of the optimized birdcage designs of FIG. 16 have a very homogeneous $B_1^+$ volume distribution. The shield size affected the efficiency.

Iterative movements of rung positions and decreasing the short axis of the top-half ellipse improved the $B_1^+$ homogeneity to 88% for the smallest and largest shield. Stretching the endings and maintaining equal areas of opposing rungs improved the homogeneity for the larger shield size, increasing to 93% inside the VOI. The mean $B_1^+$ increased by 0.2 µT-0.6 µT.

Analysis of the three common birdcage designs showed $B_1^+$ homogeneity and efficiency is strongly dependent on the position of the birdcage within the RF shield and the distance between the rungs and the shield. Optimization of the rungs' position and the coil dimensions homogenized the field distribution significantly under loaded condition. Furthermore, end-ring stretching improved the field homogeneity, approaching similar homogeneity for the desired target margin as on a traditional centered cylindrical birdcage, at the cost of efficiency and A-P dimensions. Data analysis of commonly used birdcage designs provided the insight in field pattern distribution under a loaded condition including dielectric effects. This resulted in optimizing rung spacing and end-ring shape for homogeneous $B_1^+$ excitation profiles across the entire thorax volume and ultimately identifying two potential designs for construction.

Based upon the above disclosure, it can be seen that improved homogeneity for such non-cylindrical birdcage coils may be provided by varying the capacitive elements and/or inductive elements of the LC delay circuit (with our without varying the spacing between the rungs) to provide a uniform rotational velocity of the magnetic field about a circumference of the birdcage coil in various alternate embodiments. In an embodiment, the varied capacitive elements and/or inductive elements are symmetrical between the left side and right side of the birdcage coil. Alternatively, or in addition, the varied capacitive/inductive elements involves varied inductive elements. For example, the varied inductive elements involves varied dimensions of the elongated rungs, such as, varied lengths of the elongated rungs and/or varied diameters of the elongated rungs. Various dimensions of the elongated rungs may be varied to accommodate/generate a certain inductance provided by the elongated rungs. In an embodiment, the spacing from center to center between rungs remains uniform about the circumference of the birdcage, but the dimensions of the rungs are varied (such as by varying the lengths of the rungs and/or the diameters of the rungs and/or by varying other sizes/shapes of the rungs).

The birdcage design disclosed herein may produce a homogenous excitation field at resonance frequencies other than proton (for example, may produce a homogenous excitation field at resonance frequency for sodium). The asymmetric design may permit the coil 200 to be installed on top of the patient table 108 such that the coil 200 can be easily installed and removed from the patient table 108 using appropriate mechanical connections, and also allow for a set of different coils 200 (each respectively homogenous excitation fields at different resonance frequencies) to be used and swapped in an out for different MRI applications.

Advances in recent magnet technologies allow high field magnets to be ramped down to lower field magnets, while taking advantages of modern electronics and post processing techniques. By doing so, the MRI system 100 may have the ability to operate at different resonance frequencies to excite different protons and other nuclei. Operating a low frequency offers certain advantages under some conditions.

The asymmetrical birdcage design 200 of the present disclosure can be easily retrofitted for an existing system and can operate at a different frequency than the system's body coil. This allows the existing cylindrical system body coil 114 to stay in place and avoid time consuming and costly swapping of the cylindrical body birdcage coil 114, especially if the magnet is designed to operate at multiple field strengths.

There are several advantages of having a lower field magnet for MR imaging with modern high end receiver electronics. T1 relaxation time is a function of field strength, and at lower fields, T1s are typically shorter for various tissue types allowing shorter TR (repetition time) periods and potentially reducing scan time, while generating better soft tissue contrast images. A lower field strength also reduces risk associated with heating of metallic structures used for interventional procedures performed under MRI guidance. Lower fields also reduce susceptibility artifacts, e.g., by improving imaging of patient with implants and/or by reducing specific absorption rate (SAR) deposition in the body.

Further contemplated herein is to have a plurality of asymmetrical birdcage coils 200 tuned to different frequencies either for multinuclear and/or proton that may be swapped out for different MRI applications. One Xenon, e.g., resonates at 35.3 MHz on a 3 Tesla system. If proton should have its resonance at 35.3 MHz, the magnet may have to be ramped down to a field of 0.829 Tesla. The herein disclosed asymmetrical design could serve as a proton transmit/receive (T/R) coil at 0.829 Tesla, for proton imaging. By the disclosed approach, a single coil can now serve multiple purposes. Instead of retuning the coil, e.g., the magnet can be ramped to a lower desired resonance of proton or another nucleus at the coil's resonance frequency. It is within the scope of the disclosure that different asymmetric coils 200 may be swapped out for MRI systems operating at different field strengths. For example, and without limitation, one asymmetric birdcage coil 200 configured for a field strength below 1 Tesla (low field application) and another asymmetrical birdcage coil configured for a field strength above 1 Tesla (high field application). It is also within the scope of the disclosure that different asymmetrical birdcage coils 200 can be swapped out for MRIs operating at different resonant frequencies.

Further, by having a magnet that can be ramped to different field strengths, the cylindrical body coil typically installed in a MRI system could be eliminated and replaced by an asymmetrical birdcage coil 200 provided on the patient table 108, which may be tuned to the desired resonance frequency of the desired nucleus at the magnet's field strength. Removing the traditional body coil would open the bore size further, which may offer advantages in the management of claustrophobia and permit more space for MR image guided interventions.

The asymmetry of the herein disclosed birdcage design and the associated distance to the RF shield may allow to integrate a high traditional channel phased array or grid coil onto the inside of the birdcage shell. This may create a highly integrated system, reducing the number of anatomy specific phased arrays tuned to the nucleus of interest.

The herein disclosed asymmetric and insert-able design may allow for phased arrays to be used at one or more birdcage frequencies. Those phased arrays can be integrated within the birdcage structure or be a separate piece/structure within the birdcage. For example, as shown in FIG. 20C the asymmetric birdcage coil 200 may include phased array coil incorporated therein. The phased array coil may include an anterior portion 410 coupled to the relatively domed top birdcage coil section 206 and a posterior portion 420 coupled to the relatively planar bottom birdcage coil section 208. In a further detailed embodiment, the anterior portion 410 of the phased array coil is coupled to an inner side of the top relatively domed birdcage coil section 206 and the posterior portion 420 of the phased array coil is coupled to an inner side of the bottom relatively planar birdcage coil section 208. An example of a phased array coil that could be used with the current disclosure is provided in U.S. Pat. No. 10,816,621, the enclosure of which is incorporated herein by reference. Other examples of phased array coils for use with the present disclosure will be apparent to those of ordinary skill. Prior art attempts of a 128-channel receive phased array and a 16-channel receive phased array were integrated into the magnet bore, but they may have failed because of the proximity of the receive elements to the RF shield of the cylindrical body coil. Here, the asymmetrical birdcage coil 200 (e.g., with or without a cylindrical body coil provided in the MRI housing 106) may be successfully integrated into a phased array due to the asymmetry and the associated distance to the RF shield.

Figure 20A:
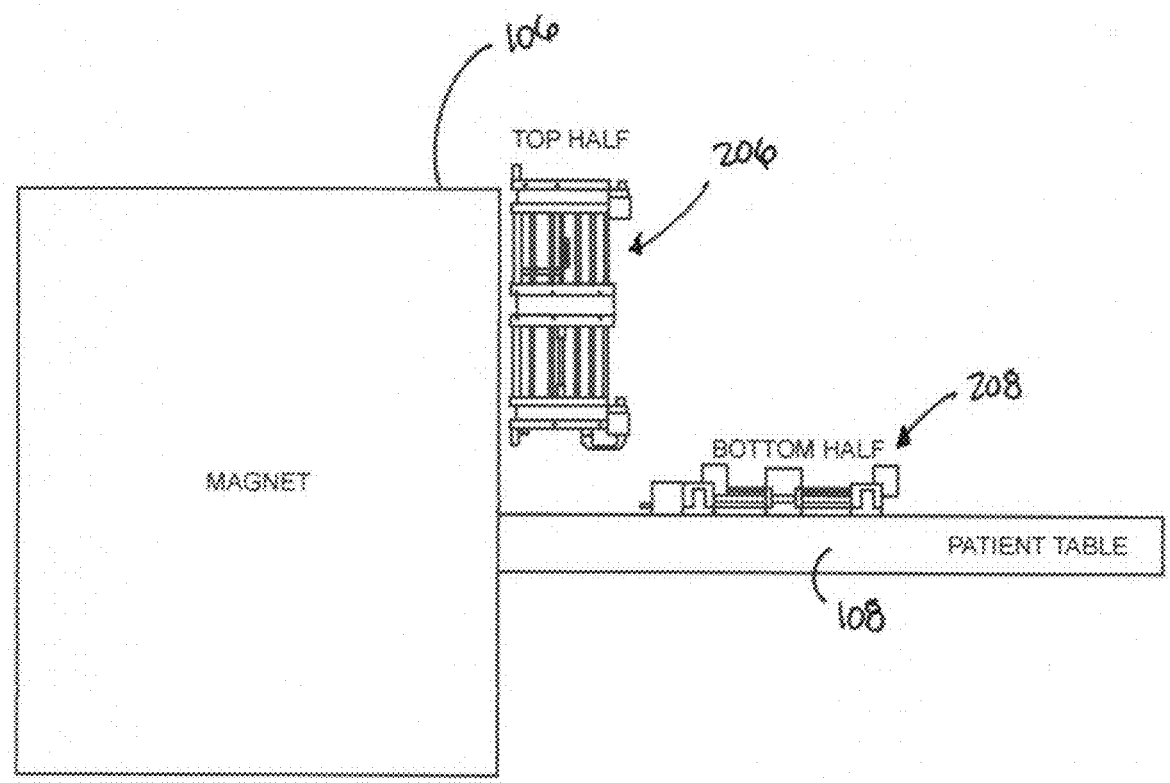
FIG. 20A shows an elevational side view of an exemplary asymmetrical birdcage coil with a mechanical linkage pivoting a top half of the asymmetrical birdcage coil 90° up from the bottom half.
Figure 20B:
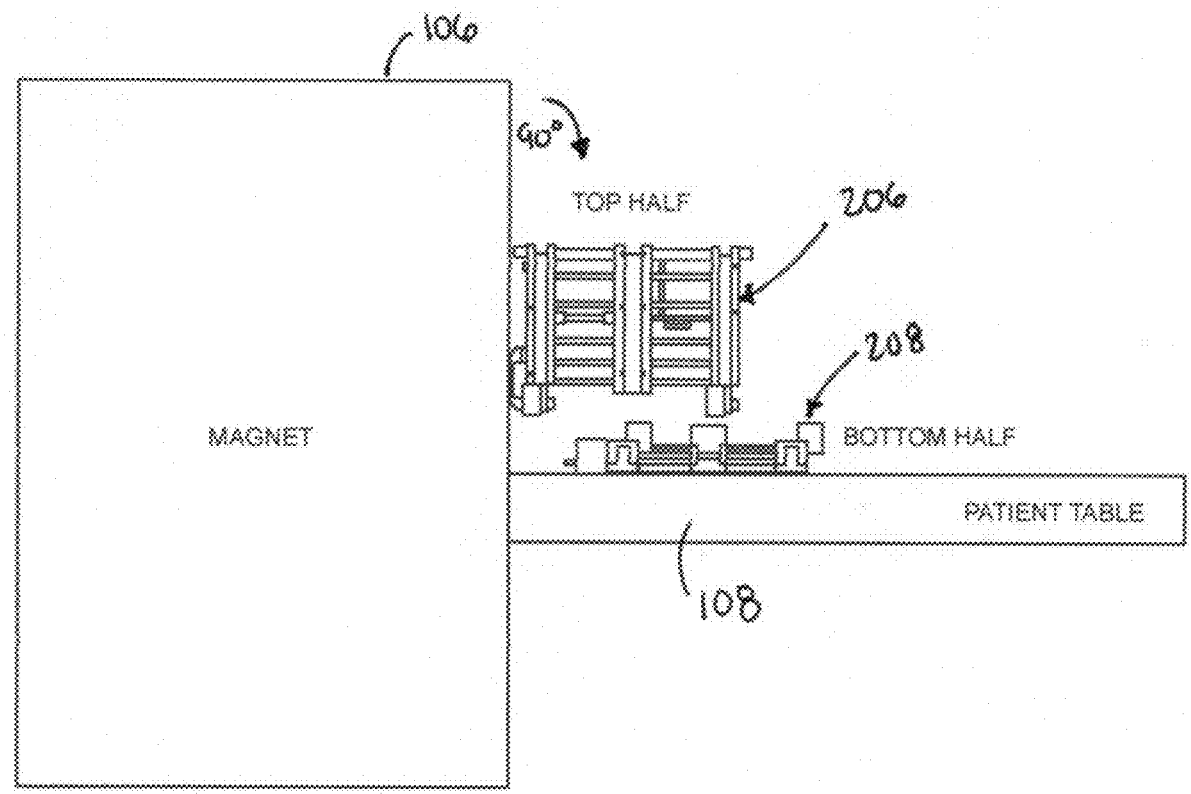
FIG. 20B shows the view and asymmetrical birdcage coil of FIG. 20A in which the mechanical linkage pivots the top half of the asymmetrical birdcage coil down 90° to be parallel to the bottom half.

The herein disclosed asymmetric birdcage coil 200 design may be added onto the MR table 108 and/or be mechanically integrated into the existing MRI system 100. A mechanical linkage or integration may help with manual opening and closing (mating of the top and bottom sections 206, 208) of the asymmetric birdcage coil 200. Mating the two halves 206, 208 together may be achieved by the MRI operator or a computer-controlled setup. For example, as shown in FIGS. 20A and 20B, the bottom half 208 may be submerged in the patient table 108, which may not allow any movements in the z-direction (i.e., the main magnetic field direction). By swapping the current connector orientation by 180° the top half could be released and mechanically caught on a mechanical linkage installed on the bore façade, as shown in FIG. 20A. As such, the patient may get positioned onto the table 108 with the bottom half 208 of the asymmetrical birdcage coil 200 in place. And the top half 206 may be held by the mechanical linkage on the bore façade 106 and be rotated/pivoted 90° towards the magnet in its idle position. For imaging, the top half 206 may need to be lowered or pivoted down 90° to be parallel with the bottom half 208 and to engage with the connectors, as is demonstrable with respect to FIG. 20B. Then, the patient on patent table 108 may be advanced to scan within the bore 105. After scan completion, the top-half 206 may be caught by the mechanical linkage, disconnecting it from the bottom half 208 and pivoting up into its idle position shown in FIG. 20A.

The connectors used for connecting the top half and bottom half of the birdcage may be oriented/aligned differently. For example, they may be planar and may engage horizontally. In another example, this may be changed into a configuration where front and back connectors are at different heights. The engaging orientation may also be changed, e.g., such that it engages vertically. But multiple other options are contemplated. Based on how the top and bottom halves are connected, the electrical design may have to compensate (e.g., by adjusting capacitor values).

The herein disclosed asymmetric birdcage coil 200 may be capable of one or more frequencies. The herein disclosed asymmetric birdcage coil 200 may be usable at one or more field strengths. The herein disclosed asymmetric birdcage coil 200 may be used with or without a phased array. The herein disclosed asymmetric birdcage coil 200 may be split-bale (such that it opens up along its axis) in any desired location and/or split-bale in any orientation. The herein disclosed approach may be irrespective of how the connectors for the split are placed. For example the top portion 206 may open along an axially extending line and open up on hinges like a pair of doors. The herein disclosed asymmetric birdcage coil 200 may operate as transmit and receive or as transmit only. The herein disclosed asymmetric birdcage coil 200 may accommodate phased array operation. The herein disclosed asymmetric birdcage coil 200 may mate manually or automatically. And the exemplary mating shown in FIGS. 20A-20B may be human controlled or computer controlled.

Having described the inventions by reference to example embodiments, it will be obvious that modifications can be made to such embodiments without departing from the scope of the invention as claimed.

The following References are incorporated by reference:
1. Walkup L L, Woods J C. Translational applications of hyperpolarized $^3$He and $^{129}$Xe. NMR in Biomed Volume 27, Issue 12 Dec. 2014 Pages 1429-1438.
2. Stewart N J, Horn F C, Norquay G, et al. Reproducibility of Quantitative Indices of Lung Function and Microstructure from $^{129}$Xe Chemical Shift Saturation Recovery (CSSR) MR Spectroscopy. Magn Reson Med 77:6 (2017) 2107-2113.
3. Kaushik S S, Robertson S H, Freeman M S et al., Single-Breath Clinical Imaging of Hyperpolarized $^{129}$Xe in the Airspaces, Barrier, and Red Blood Cells Using an Interleaved 3D Radial 1-Point Dixon Acquisition. Magn Reson Med 75:4 (2016) 1424-1443.
4. Ruppert K, Altes T, Mata J F, et al., Detecting Pulmonary Capillary Blood Pulsations Using Hyperpolarized Xenon- 129 Chemical Shift Saturation Recovery (CSSR) MR Spectroscopy. Magn Reson Med 75:4 (2016) 1771-1780.
5. Wetterling F, Corteville D M, Kalayciyan R, et al. Whole body sodium MRI at 3 T using an asymmetric birdcage resonator and short echo time sequence: first images of a male volunteer. Phys. Med. Biol. 57 (2012) 4555-4567.
6. Zanche N D, Chhina N, Teh K, et al. Asymmetric Quadrature Split Birdcage Coil for Hyperpolarized $^3$He Lung MRI at 1.5 T. Magn Reson Med 60:431-438 (2008).
7. Dregely I, Ruset I C, 2 Wiggins G, et al. 32-Channel Phased-Array Receive with Asymmetric Birdcage Transmit Coil for Hyperpolarized Xenon-129 Lung Imaging. Magn Reson Med 70:576-583 (2013).

What is claimed is:

1. A birdcage coil for a magnetic resonance imaging (MRI) system, the birdcage coil comprising:
   a relatively planar birdcage coil section, including a pair of relatively planar ring portions and a plurality of conductive, elongated rungs extending between the pair of relatively planar ring portions;
   a relatively domed birdcage coil section, including a pair of relatively domed ring portions and a plurality of conductive, elongated rungs extending between the pair of relatively domed ring portions; and
   at least two sets of the relatively planar and domed birdcage coil sections, each of the at least two sets being configured to a different MRI application;
   wherein the relatively domed birdcage coil section is releasably coupled to the relatively planar birdcage coil section.

2. The birdcage coil of claim 1, wherein the relatively domed birdcage coil section includes handles to facilitate manual removal and replacement of the relatively domed birdcage coil section on the relatively planar birdcage coil section.

3. The birdcage coil of claim 1, wherein the relatively planar birdcage coil section is adapted to be coupled to or integrated into a patient table received into and out of an MRI bore.

4. The birdcage coil of claim 1, wherein the different MRI applications include at least two different MRI field strengths.

5. The birdcage coil of claim 4, wherein the at least two different MRI field strengths include a first field strength below 1 Tesla and a second field strength above 1 Tesla.

6. The birdcage coil of claim 1, wherein the different MRI applications include at least two different resonant frequencies.

7. The birdcage coil of claim 1, wherein each of the at least two sets includes means for providing a uniform rotational velocity of a magnetic field about a circumference of the birdcage coil respectively when each the at least two of the relatively domed birdcage coil sections are connected to the relatively planar birdcage coil section.

8. The birdcage coil of claim 1, wherein the relatively planar birdcage coil section includes a surface for a patient to lay upon.

9. The birdcage coil of claim 1, further comprising a phased array coil incorporated therein.

10. The birdcage coil of claim 9, wherein the phased array coil includes an anterior portion coupled to the relatively domed birdcage coil section and a posterior portion coupled to the relatively planar birdcage coil section.

11. The birdcage coils of claim 10, wherein the anterior portion of the phased array coil is coupled to an inner side of the relatively domed birdcage coil section and the posterior portion of the phased array coil is coupled to an inner side of the relatively planar birdcage coil section.

12. The birdcage coil of claim 1, that is configured only for transmission.

13. The birdcage coil of claim 1, that is configured for both transmission and reception.

14. A birdcage coil for a magnetic resonance imaging (MRI) system, the birdcage coil comprising:
   a pair of conductive end rings, each having a generally domed shape in axial cross section;
   a plurality of conductive, elongated rungs extending between the pair of conductive end rings in an axial direction;
   the birdcage coil being designed to be selectively opened along its axis; and
   at least two sets of relatively planar and domed birdcage coil sections, each of the at least two sets being configured to a different MRI application.

15. The birdcage coil of claim 14, wherein the birdcage coil includes:
   at least one of the relatively planar birdcage coil sections, including a pair of relatively planar ring portions and a plurality of conductive, elongated rungs extending between the pair of relatively planar ring portions; and
   at least one of the relatively domed birdcage coil sections, including a pair of relatively domed ring portions and a plurality of conductive, elongated rungs extending between the pair of relatively domed ring portions;
   wherein the relatively domed birdcage coil section is releasably coupled to the relatively planar birdcage coil section so that the birdcage coil can be opened along its axis.

16. A birdcage coil for an MRI system, the birdcage coil comprising:
   a pair of conductive end rings, each having a generally domed shape in axial cross section;
   a plurality of conductive, elongated rungs extending between the pair of conductive end rings in an axial direction;
   the birdcage coil being designed to be selectively opened along its axis;
   a relatively planar birdcage coil section and a relatively planar domed birdcage coil section; and
   a mechanical linkage, between the relatively domed birdcage section and the relatively planar birdcage section, facilitating opening and closing of the birdcage coil.

17. The birdcage coil of claim 16, wherein the mechanical linkage includes a pivot assembly coupled between the relatively domed birdcage section and an MRI magnet housing, the pivot assembly configured to pivot the relatively domed birdcage section between an open position and a closed position.

18. The birdcage coil of claim 16, further comprising a computer control associated with the mechanical linkage facilitating automated opening and closing of the birdcage coil.

19. An MRI system, comprising:
   a magnet housing including a cylindrical superconducting magnet encased therein and an axial bore extending therethrough;
   a patient support table coupled to the magnet housing for moving a patient into and out of the axial bore; and
   an asymmetrical birdcage coil coupled to a top surface of the patient support table, the asymmetrical birdcage coil including a planar portion coupled to the top surface of the patient support table and a domed portion positioned over the planar portion;

wherein the magnet housing does not include a body coil, and wherein the asymmetrical birdcage coil includes means for providing a uniform rotational velocity of a magnetic field about a circumference of the birdcage coil.

\* \* \* \* \*